(12) United States Patent
Lee et al.

(10) Patent No.: US 8,278,641 B2
(45) Date of Patent: Oct. 2, 2012

(54) FABRICATING CURRENT-CONFINING STRUCTURES IN PHASE CHANGE MEMORY SWITCH CELLS

(75) Inventors: Jong-Won Sean Lee, San Francisco, CA (US); DerChang Kau, Cupertino, CA (US); Gianpaolo Spadini, Campbell, CA (US)

(73) Assignee: Intel Corporation, Santa Clara, CA (US)

( * ) Notice: Subject to any disclaimer, the term of this patent is extended or adjusted under 35 U.S.C. 154(b) by 142 days.

(21) Appl. No.: 12/646,267

(22) Filed: Dec. 23, 2009

(65) Prior Publication Data

US 2011/0147695 A1 Jun. 23, 2011

(51) Int. Cl.
*H01L 47/00* (2006.01)
(52) U.S. Cl. ..................... 257/4; 257/E45.002
(58) Field of Classification Search ........ 257/4, E45.002
See application file for complete search history.

(56) References Cited

U.S. PATENT DOCUMENTS

| | | | |
|---|---|---|---|
| 6,605,527 B2 | 8/2003 | Dennison et al. | |
| 6,625,054 B2 | 9/2003 | Lowrey et al. | |
| 6,770,531 B2 | 8/2004 | Lowrey et al. | |
| 6,795,338 B2 | 9/2004 | Parkinson et al. | |
| 6,797,979 B2 | 9/2004 | Chiang et al. | |
| 7,135,696 B2 | 11/2006 | Karpov et al. | |
| 2005/0112896 A1* | 5/2005 | Hamann et al. | 438/694 |
| 2006/0249725 A1 | 11/2006 | Lee | |
| 2007/0297213 A1 | 12/2007 | Czubatyj et al. | |
| 2008/0090324 A1 | 4/2008 | Lee et al. | |
| 2009/0111249 A1 | 4/2009 | Lee | |
| 2009/0194756 A1 | 8/2009 | Kau et al. | |
| 2009/0196091 A1 | 8/2009 | Kau et al. | |

* cited by examiner

*Primary Examiner* — Matthew Reames
(74) *Attorney, Agent, or Firm* — Cool Patent, P.C.; Joseph P. Curtin

(57) ABSTRACT

In one or more embodiments, methods of fabricating current-confining stack structures in a phase change memory switch (PCMS) cell are provided. One embodiment shows a method of fabricating a PCMS cell with current in an upper chalcogenide confined in the row and column directions. In one embodiment, methods of fabricating a PCMS cell with sub-lithographic critical dimension memory chalcogenide are shown. In another embodiment, methods of fabricating a PCMS cell with sub-lithographic critical dimension middle electrode heaters are disclosed.

7 Claims, 28 Drawing Sheets

FABRICATING CURRENT-CONFINING STRUCTURES IN PHASE CHANGE MEMORY SWITCH CELLS

BACKGROUND

Phase-change memory devices use phase-change materials for non-volatile storage in electronic memory applications. Phase-change materials may be electrically switched between a generally amorphous and a generally crystalline state. One type of memory element utilizes a phase-change material that may be, in one application, electrically switched between a structural state of generally amorphous and generally crystalline local order or between different detectable states of local order across the entire spectrum between completely amorphous and completely crystalline states. The phase-change materials are non-volatile in that, when set in a crystalline, semi-crystalline, amorphous, or semi-amorphous state representing a resistance value, that value is retained until changed by another programming event. The phase-change materials remain in the set phase or physical state of the value the phase-change material represents.

Power consumption in phase-change memory devices can be significant. Reducing the power consumption in phase-change memory devices is a design consideration, especially for use in portable electronic devices. Another consideration during the design of phase-change memory devices includes dealing with the complexity of phase-change materials in semiconductor processing. Further, switch devices in phase-change memory devices are not physically isolated and contribute to cell-to-cell disturb, thus limiting scaling of architecture.

BRIEF DESCRIPTION OF THE DRAWINGS

The claimed subject matter will be understood more fully from the detailed description given below and from the accompanying drawings of disclosed embodiments which, however, should not be taken to limit the claimed subject matter to the specific embodiment(s) described, but are for explanation and understanding only.

It will be appreciated that for simplicity and clarity, the figures and the elements therein are not necessarily drawn to scale. Some features in the figures may be exaggerated to show particular details.

DETAILED DESCRIPTION

Figure 1:
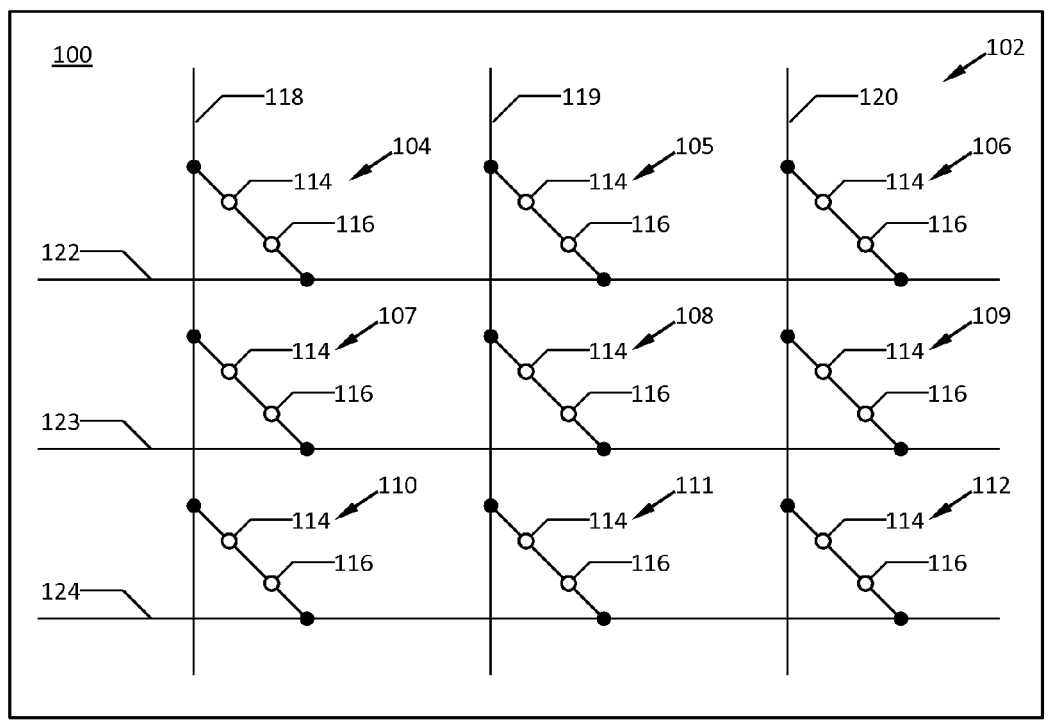
FIG. 1 is a schematic diagram of a portion of a memory in accordance with one embodiment.

Referring to FIG. 1, a schematic diagram of a portion of a memory 100 including a memory array 102 is shown according to one embodiment. As an example, memory array 102 may include a 3×3 array of memory cells 104-112. In one embodiment, each memory cell 104-112 includes a memory element 114 and a select device 116. Although a 3×3 array is illustrated in FIG. 1, the scope of the claimed subject matter is not limited in this respect. Memory 100 may include a larger array of memory cells.

In one embodiment, memory array 102 may be formed on a portion of a substrate (not shown). The substrate may include a semiconductor substrate, such as a silicon substrate. Other substrates, such as those containing ceramic material, organic material, or glass material, may be suitable for use. The disclosure below details the formation of a portion of memory array 102 including memory cells. Many, and possibly all, memory cells of memory array 102, along with other integrated circuit circuitry may be fabricated simultaneously.

Memory 100 may include column lines 118-120 and row lines 122-124 to select a particular memory cell of the memory array 102 during a program or read operation. In one embodiment, column lines 118-120 and row lines 122-124 may be referred to as address lines since these lines may be used to address memory cells 104-112 during programming or reading. In one embodiment, column lines 118-120 may be referred to as bit lines and row lines 122-124 may be referred to as word lines.

Memory elements 114 may be connected to row lines 122-124 and may be coupled to column lines 118-120 via select devices 116. When a particular memory cell is selected, voltage potentials may be applied to the memory cell's associated column line and row line to apply a voltage potential across the memory cell. In one example, a voltage is applied to column line 119 and row line 122 to read memory cell 105.

In one embodiment, memory 100 may be referred to as a phase-change memory. Memory elements 114 may comprise a phase-change material and may be referred to as phase-change memory elements in one embodiment. The phase-change material may be a material having electrical properties such as, for example, resistance, capacitance, etc. These properties may be changed through the application of energy such as, for example, heat, light, voltage potential, or electrical current. Examples of a phase-change material may include a chalcogenide and an ovonic material. The chalcogenide may be a material that includes at least one element from column VI of the periodic table or may be a material that includes one or more of the chalcogen elements. For example, chalcogen elements may include tellurium (Te), sulfur (S), or selenium (Se). The ovonic material may be a material that undergoes electronic or structural changes and acts as a semiconductor when subjected to the application of energy. The ovonic material may be used in memory element 114 or in select device 116.

As used herein, in general, "chalcogenide" may be used either as a phase-change memory material or a switching material. When chalcogenide is in memory element 114 and utilized as phase change memory material, chalcogenide may be referred to as "memory chalcogenide." When chalcogenide is used in select device 116 and intended to be a switching material, chalcogenide may be referred to as "switch chalcogenide."

Select device 116 may be used to access memory element 114 during programming or reading of memory element 114. Select device 116 may operate as a switch that is either "off" or "on" depending on the amount of voltage potential applied across a memory cell. The "off" state may be a substantially electrically nonconductive state and the "on" state may be a substantially conductive state. For example, select device 116 may have a threshold voltage and if a voltage potential less than the threshold voltage of select device 116 is applied across select device 116, then select device 116 may remain "off" or in a relatively high-resistive state so that little or no electrical current passes through the memory cell. Alternatively, if a voltage potential greater than the threshold voltage of select device 116 is applied across select device 116, then select device 116 may turn "on." While select device 116 is on, select device 116 operates in a relatively low-resistive state so that electrical current passes through the memory cell. In other words, select device 116 may be in a substantially electrically nonconductive state if less than a predetermined voltage potential, such as the threshold voltage, is applied across select device 116. Select device 116 may be in a substantially conductive state if greater than the predetermined voltage potential is applied across select device 116. Select device 116 may also be referred to as an access device, an isolation device, or a switch.

In one embodiment, select device 116 may comprise a switching material such as, for example, a chalcogenide or an ovonic material, and may be referred to as an ovonic threshold switch (OTS), or simply an ovonic switch. The switching material of select device 116 may be a material in a substantially amorphous state positioned between two electrodes, or an interconnect material and an electrode. The switching material may be repeatedly and reversibly switched between a higher resistance "off" state and a relatively lower-resistance "on" state by application of a predetermined electrical current or voltage potential. For example, in the "off" state, resistance may be greater than about ten mega-ohms, and in contrast, in the "on" state, about zero ohms. In one embodiment, select device 116 may be a two terminal device that may have a current-voltage (I-V) characteristic similar to a phase-change memory element that is in the amorphous state. Unlike a phase-change memory element, however, the switching material of select device 116 may not change phase. That is, the switching material of select device 116 may not be a programmable material, and as a result, select device 116 may not be a memory device capable of storing information. For example, the switching material of select device 116 may remain permanently amorphous and the I-V characteristic may remain the same throughout the operating life.

During programming of a memory cell, the state of the phase-change memory material in the memory cell may be altered. This may be referred to as a "phase-change action." A voltage potential is applied to a row interconnect material and a column interconnect material which generates a voltage potential between memory element 114 and select device 116. An electrical current flows through the phase-change memory material in response to the applied voltage potential which results in heating of the phase-change memory material. The phase-change memory material may change state and resistance.

In one convention, the phase-change memory material may be in an amorphous state considered the "reset" state. In a crystalline state, the phase-change memory material may be considered to be in a "set" state. The resistance of phase-change memory material in the amorphous state may be greater than the resistance of phase-change memory material in the crystalline state. The claimed subject matter is not limited in such a way, as the opposite of this convention may apply.

Using electrical current, phase-change memory material may be heated to a relatively higher temperature to alter phase-change memory material and "reset" the phase-change memory material. Heating to a higher temperature allows for programming the phase-change memory material to a "0" value. Heating the volume of phase-change memory material to a relatively lower crystallization temperature may crystallize phase-change memory material and "set" phase-change memory material. Heating to a lower temperature allows for programming the phase-change memory material to a "1" value. Various resistances of phase-change memory material may be achieved to store information by varying the amount of current flow and duration through the volume of phase-change memory material.

Referring to FIGS. 2-41, portions of one or more memory cells 104-112 are depicted at different stages of fabricating current-confining structures in memory cells according to one or more embodiments. In particular, FIGS. 2-11 show a fabrication process of a portion of a memory cell including confining current in an upper location memory element 114. In multiple embodiments, FIGS. 12-19 show formation of a portion of a memory cell with memory element 114 at sub-critical dimension (sub-CD) and FIGS. 20-24 and FIGS. 25-27 illustrate other ways of formation of sub-CD memory elements 114. In multiple embodiments, FIGS. 28-35, FIGS. 36-38 and FIGS. 39-41 depict fabrication processes of a sub-CD heater electrode in contact with memory element 114. In one or more embodiments, damascene processing may be used in fabricating current-confining structures. Further, when referring to intermediate structures, these are generally structures for temporary and/or illustrative purposes and are not intended to refer to permanent structures.

According to one or more embodiments, current confinement may improve thermal efficiency of a phase-change action, which translates into lower power consumption. In one embodiment, upper chalcogenide may be confined in a row direction as well as a column direction. In one embodiment, minimizing a contact area between an electrode and a phase-change memory material may reduce the power required to program a memory cell. The contact area may be defined as the surface in which the electrode interfaces with the phase-change memory material. In one embodiment, minimizing a contact area between a heater electrode and the phase-change memory material may lead to current reduction during programming. This also allows current confinement in structures in accordance with one or more embodiments.

Figure 2:
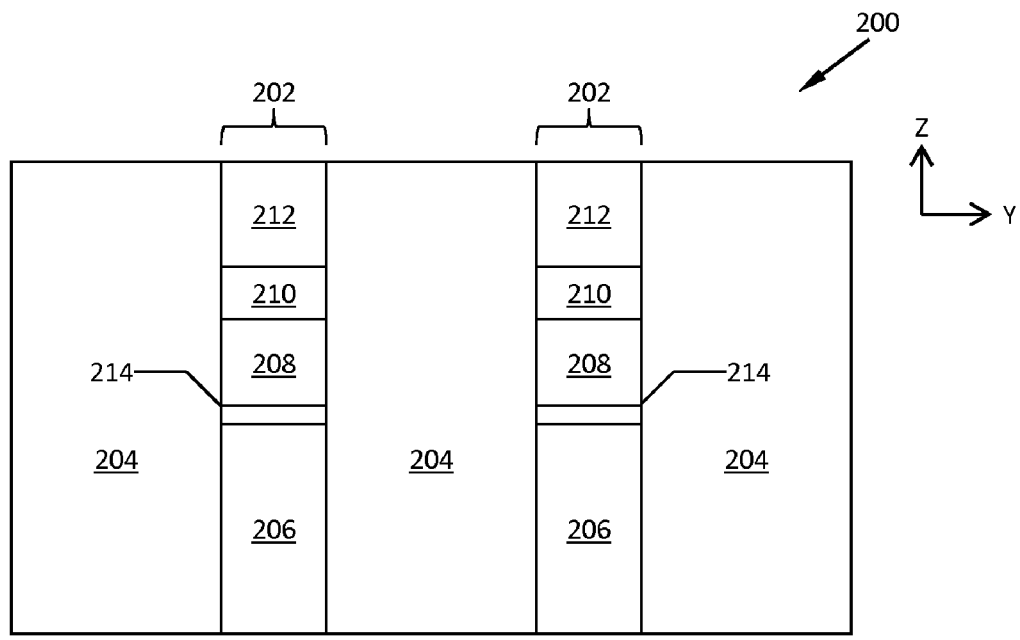
FIG. 2 is a cross-sectional view depicting an intermediate structure during fabrication of a portion of a memory cell of FIG. 1 in accordance with one embodiment.

Referring now to FIG. 2, a depiction of an intermediate structure 200 during fabrication of a portion of a memory array 102 of FIG. 1 is shown in accordance with one embodiment. Intermediate structure 200 includes row stack structures 202 that have been patterned and isolation trenches between the row stack structures 202 filled with insulator 204. Conventional etching techniques may be used in patterning the row stack structures 202. Intermediate structure 200 may be formed above a substrate.

In a non-limiting example, insulator 204 may include dielectric material or insulating film that may be formed in between the patterned row stack structures 202. In one embodiment, dielectric material may include silicon dioxide ($SiO_2$), silicon oxide (SiO), silicon nitride ($Si_3N_4$), or combinations thereof. In another embodiment, dielectric material may include a material selected with thermal conductivity κ values less than 1.0. In one embodiment, insulator 204 may be formed using plasma enhanced chemical vapor deposition (PECVD), high density plasma chemical vapor deposition (HDPCVD), spin-on, sol-gel, or other suitable processes. In one or more embodiments, insulator 204 may be considered to be a sacrificial material and/or used as a mask.

According to one embodiment, row stack structure 202 may include layers of a row interconnect material 206, a chalcogenide 208 and a middle electrode 210. Row stack structure 202 may further include a layer of chemical barrier material 214 located between row interconnect material 206 and chalcogenide 208. In one embodiment, the layers of row interconnect material 206, chalcogenide 208 and middle electrode 210 may be masked and dry etched to pattern the row stack structures 202. In one example, an anisotropic etch may be used to pattern the row stack structures 202. Sacrificial material 212 may be incorporated on top of row stack structures 202, which is self-aligned to row by patterning together.

In one embodiment, one or more layers of row stack structure 202 may be applied using a deposition technique. Such deposition techniques include physical vapor deposition (PVD), chemical vapor deposition (CVD), metal-organic chemical vapor deposition (MOCVD), plasma enhanced chemical vapor deposition (PECVD), high density plasma chemical vapor deposition (HDPCVD), laser assisted chemical vapor deposition, and atomic layer deposition (ALD), but the claimed subject matter is not limited in this respect. One or more of these deposition techniques may be selected for appropriate application of various different layers mentioned in this disclosure.

Row interconnect material 206 may include any suitable conductor. Examples of row interconnect material 206 include copper, aluminum, copper alloys, and aluminum alloys. As another example, row interconnect material 206 may be a polycrystalline film with cobalt silicide ($CoSi_2$) on the top surface. The row interconnect material 206 may correspond to row lines, such as 122-124 of FIG. 1, for addressing memory cells. A voltage potential between the row interconnect material 206 and a column interconnect material, to be deposited in a subsequent stage of manufacture, may be used to program and read memory cells.

In one embodiment, row interconnect material 206 may have a thickness ranging from about 100 Å to about 20,000 Å. In one embodiment, row interconnect material 206 may have a thickness ranging from about 300 Å to about 5,000 Å. In one embodiment, row interconnect material 206 may have a thickness of about 2,000 Å.

According to one embodiment, chalcogenide 208 may be a memory chalcogenide or a switch chalcogenide. As mentioned above, memory chalcogenide may be programmable due to the ability to change phase whereas switch chalcogenide is not programmable due to its inability to change phase. If chalcogenide 208 comprises memory chalcogenide, then a later formed chalcogenide in the memory cell comprises a switch chalcogenide, and vice versa, as will be further described below.

In one embodiment, there is flexibility to place memory chalcogenide and switch chalcogenide in either of lower and upper locations within the memory cell. The lower location refers to a position closer to row interconnect material 206 and underlying substrate (not shown) of the memory cell, whereas the upper location refers to a position located above the middle electrode 210. In general, as used herein, "lower chalcogenide" refers to chalcogenide that is located closer to row interconnect material and "upper chalcogenide" refers to chalcogenide that is located closer to column interconnect material.

In one or more embodiments, if upper chalcogenide is fabricated with memory chalcogenide, the electrical current density may be preserved throughout the region near the memory chalcogenide. In one or more embodiments, if the upper chalcogenide is fabricated with switch chalcogenide, when active, the electrical current may be strictly confined within the switch chalcogenide.

Commonly, chalcogenide refers to alloys including at least one element from column VI of the Periodic Table of Elements. Examples of chalcogenide include, but are not limited to, compositions of the class of tellurium-germanium-antimony ($Te_xGe_ySb_z$). In one embodiment, chalcogenide 208 includes $Ge_2Sb_2Te_5$.

In one embodiment, chalcogenide 208 may be a switch chalcogenide comprising tellurium and/or selenium. In another embodiment, switch chalcogenide may comprise silicon (Si), tellurium (Te), arsenic (As), and germanium (Ge), or combinations of these elements. In other embodiments, a composition for switch chalcogenide may include an alloy of silicon (Si), tellurium (Te), arsenic (As), germanium (Ge), and indium (In) or an alloy of Si, Te, As, Ge, and phosphorous (P), but the claimed subject matter is not limited in this respect.

According to one embodiment, chalcogenide 208 may be deposited to a thickness in the range of about 10 Å to about 2,000 Å. In one embodiment, the thickness of chalcogenide 208 is in the range of about 100 Å to about 1,200 Å. In one embodiment, the thickness is on the order of about 600 Å.

Middle electrode 210 may be comprised of a thin-film material having a film thickness ranging from about 20 Å to about 2,000 Å. In one embodiment, the thickness of middle electrode 210 may range from about 100 Å to about 1,000 Å. In another embodiment, the thickness of middle electrode 210 may be about 300 Å. Suitable materials for middle electrode 210 may include titanium (Ti), titanium nitride (TiN), titanium tungsten (TiW), carbon (C), silicon carbide (SiC), titanium aluminum nitride (TiAlN), titanium silicon nitride (TiSiN), polycrystalline silicon, tantalum nitride (TaN), some combination of these films, or other suitable conductors or resistive conductors compatible with chalcogenide 208.

When referring to "middle electrode," it should be understood that middle electrode 210 may be an intermediate or an adjacent electrode and not necessarily an electrode that is in the middle of the stack, electrodes, etc. Further, middle electrode 210 may include one or more of top or bottom electrodes for memory chalcogenide and switch chalcogenide. The electrodes of the memory chalcogenide and switch chalcogenide may not be required to be identical in composition. In an example in which memory chalcogenide is located in an upper location, an electrode on the bottom of memory element 114 of FIG. 1 and an electrode on the top of select device 116 of FIG. 1 may be considered together to compose middle electrode 210.

As non-limiting examples, the layer of sacrificial material 212 may include carbon and/or spin-on glass. The sacrificial material 212 may be an etch-stop layer for chemical mechanical polishing (CMP). In another example, the sacrificial material 212 may include SiN or polycrystalline silicon films. In one embodiment, the thickness of the sacrificial material 212 may range from about 20 Å to about 4000 Å, and may depend on the desired thickness of chalcogenide that will be subsequently deposited in a trench caused by the vacancy of sacrificial material 212.

The layer of chemical barrier 214 located between row interconnect material 206 and chalcogenide 208 may be a thin film for preventing a chemical reaction between column interconnect material 206 and chalcogenide 208. Chemical barrier 214 may comprise Ti, TiN, TiW, C, SiC, TiAlN, TiSiN, polycrystalline silicon, TaN, some combination of these, or other suitable conductors or resistive conductors. The layer of chemical barrier 214 may be optional and if the chemical barrier 214 is absent from the row stack structures 202, chalcogenide 208 may be applied on row interconnect material 206 and sandwiched between middle electrode 210 and row interconnect material 206.

Figure 3:
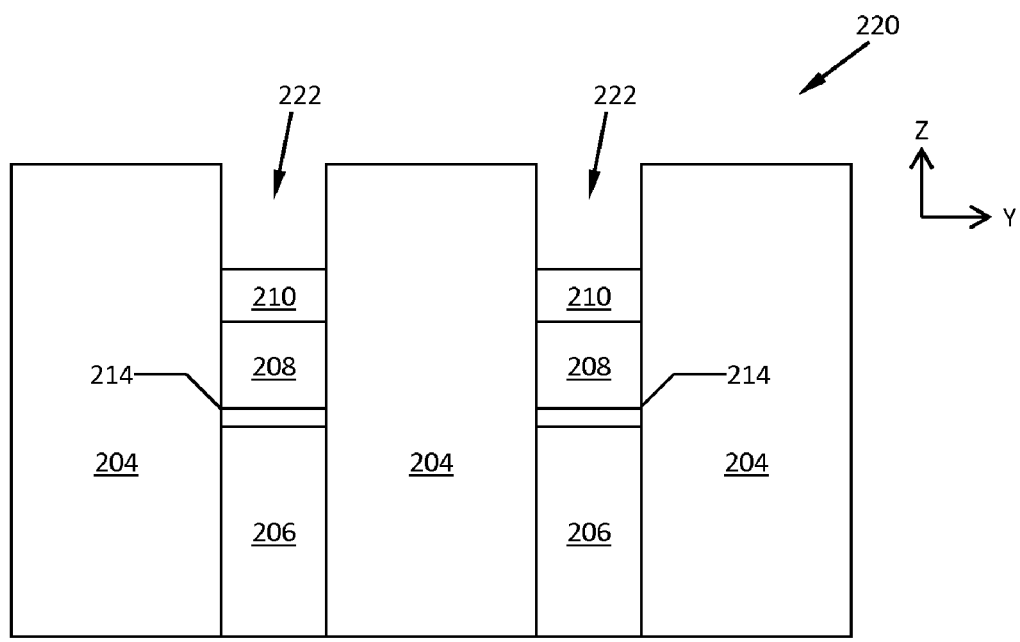
FIG. 3 is a cross-sectional view of the structure of FIG. 2 at a subsequent stage of fabrication in accordance with one embodiment.

Referring to FIG. 3, the structure of FIG. 2, depicted as 220, after the sacrificial material 212 is removed in accordance with one embodiment. In one embodiment, the sacrificial material 212 may be removed using a selective etch without removal of the underlying middle electrode 210 or insulator 204. In one embodiment, the sacrificial material 212 being carbon is removed leaving behind trenches 222 self-aligned to row stack structures 202.

Figure 4:
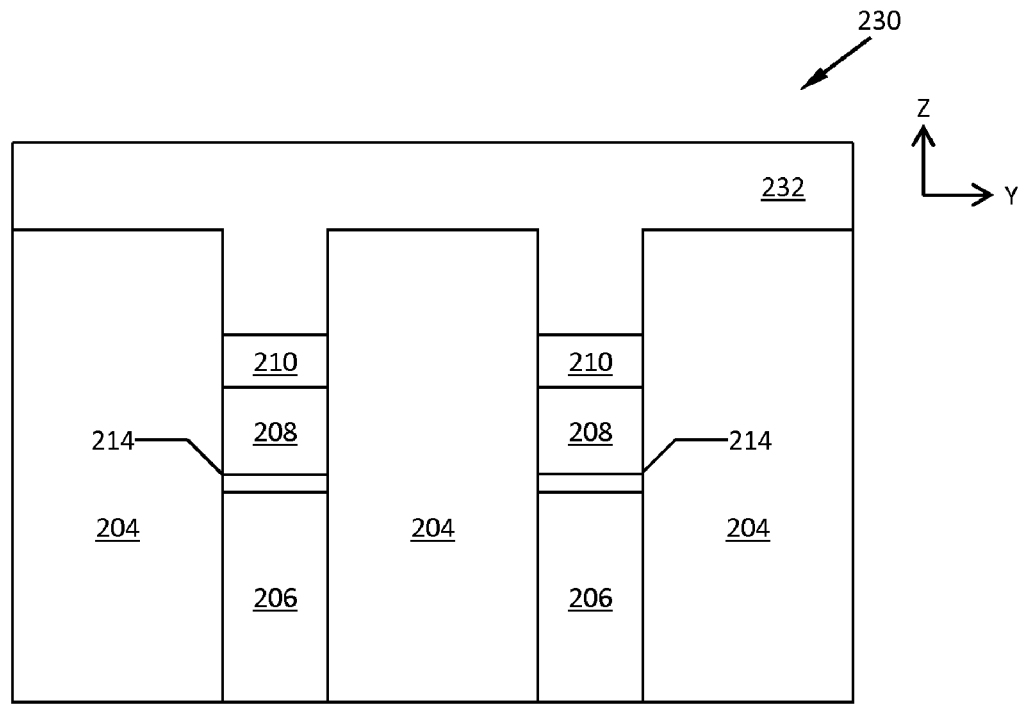
FIG. 4 is a cross-sectional view of the structure of FIG. 3 at a subsequent stage of fabrication in accordance with one embodiment.

With reference to FIG. 4, the structure of FIG. 3 after deposition of a layer of a chalcogenide 232 is depicted as structure 230 in accordance with one embodiment. Chalcogenide 232 may fill in trenches 222 completely and overlie insulator 204. In one embodiment, chalcogenide 232 may be deposited to a thickness in the range of about 10 Å to about 2,000 Å. In one embodiment, the thickness of chalcogenide 208 is in the range of about 100 Å to about 1,200 Å. In one embodiment, the thickness is on the order of about 600 Å. Chalcogenide 232 may be applied using a deposition technique, such as PVD or CVD according to one embodiment.

Figure 5:
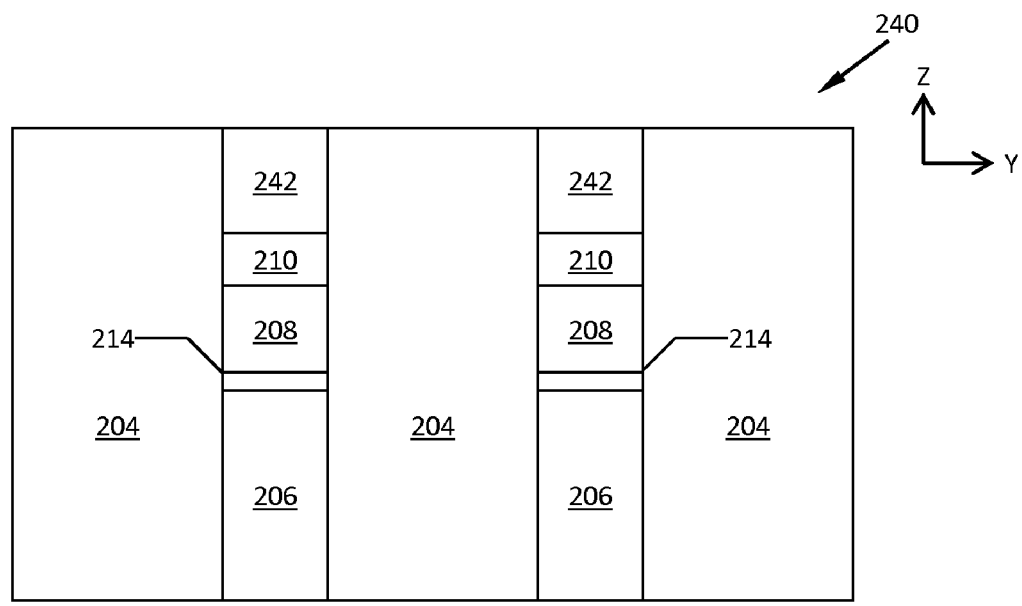
FIG. 5 is a cross-sectional view of the structure of FIG. 4 at a subsequent stage of fabrication in accordance with one embodiment.

Referring to FIG. 5 shows the structure of FIG. 4, depicted as structure 240 after removing excess chalcogenide 232 in accordance with one embodiment. A chemical-mechanical polishing (CMP) process may be used to remove undesired chalcogenide. As the surface of structure 240 is planarized during the CMP process, chalcogenide 232 that is not in the trenches 222 is removed and chalcogenide 242 is formed on top of and aligned with the row stack structure 202.

Figure 6:
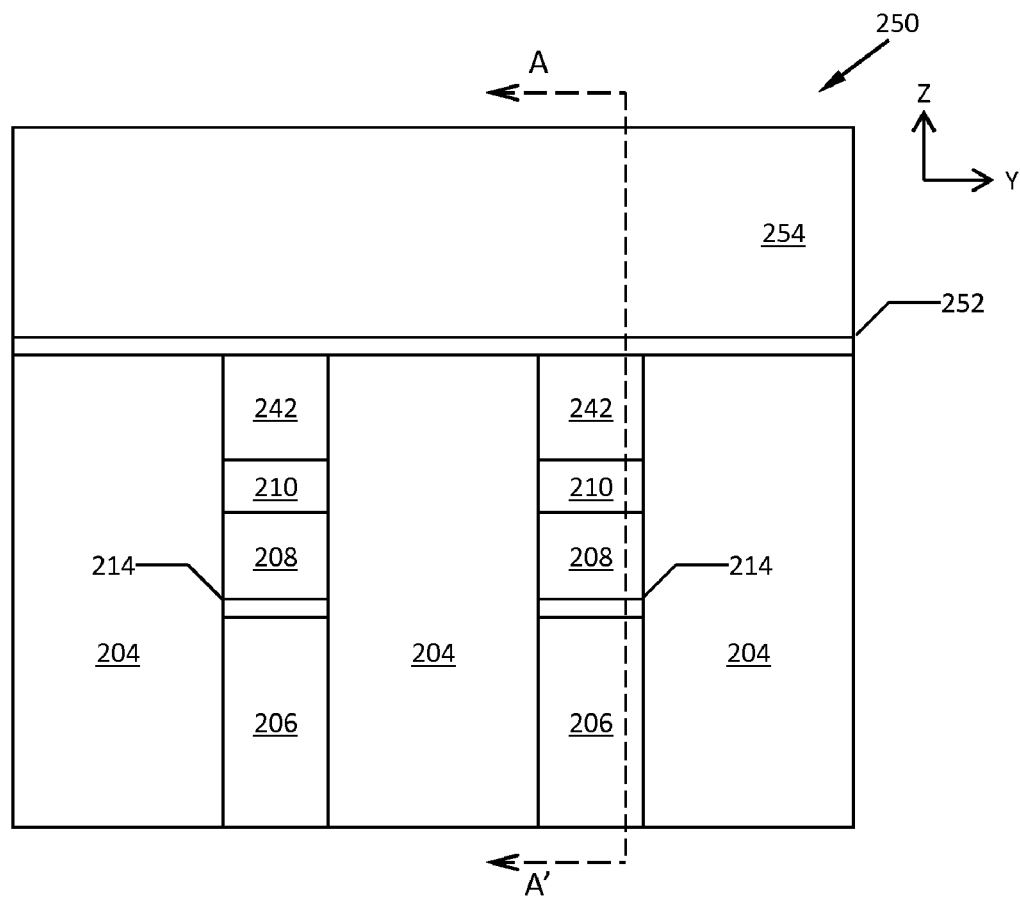
FIG. 6 is a cross-sectional view of the structure of FIG. 5 at a subsequent stage of fabrication in accordance with one embodiment.

Turning to FIG. 6, at 250, once a planar surface has been obtained on the structure of FIG. 5, a layer of a chemical barrier 252 may be applied to the planar surface of the structure 240. A layer of column interconnect material 254 may be deposited on top of the layer of chemical barrier 252. The layer of chemical barrier 252 may be a thin film for preventing a chemical reaction between chalcogenide 242 and column interconnect material 254. Chemical barrier 252 may comprise Ti, TiN, TiW, C, SiC, TiAlN, TiSiN, polycrystalline silicon, TaN, some combination of these, or other suitable conductors or resistive conductors. In one embodiment, chemical barrier 252 is optional and the column interconnect material 254 may be directly formed on the planar surface of the structure 240.

As non-limiting examples, column interconnect material 254 may include suitable conductors,. such as copper, copper alloys, aluminum, and aluminum alloys, and polycrystalline film with cobalt silicide ($CoSi_2$). Column interconnect material 254 may correspond to column lines, such as 118-120 of FIG. 1, for addressing memory cells for programming and reading.

In one embodiment, column interconnect material 206 may have a thickness ranging from about 100 Å to about 20,000 Å. In one embodiment, column interconnect material 206 may have a thickness ranging from about 300 Å to about 5,000 Å. In one embodiment, column interconnect material 206 may have a thickness of about 2,000 Å.

After forming column interconnect material 254, column patterning may be performed to create column stack structures 256, which are more clearly shown in FIGS. 7-11. During column patterning, chemical barrier 252 and column interconnect material 254 may be etched in a column-wise direction (y direction), thus forming column stack structures 256. In one embodiment, as shown at 260, chalcogenide 242 may also be etched and considered to be part of column stack structures 256. In one embodiment, middle electrode 210 may also be cut in a column-wise direction. For example, anisotropic etch is suitable for patterning in one or more embodiments.

Figure 7:
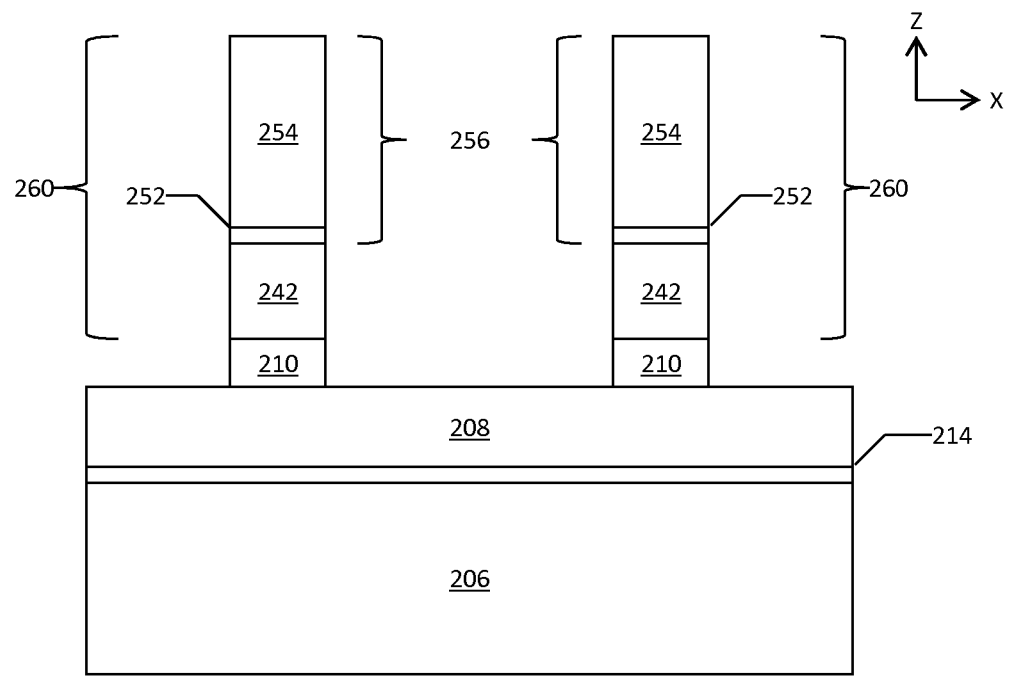
FIG. 7 is a cross-sectional view of the structure of FIG. 6 through line A-A' in accordance with one embodiment.
Figure 8:
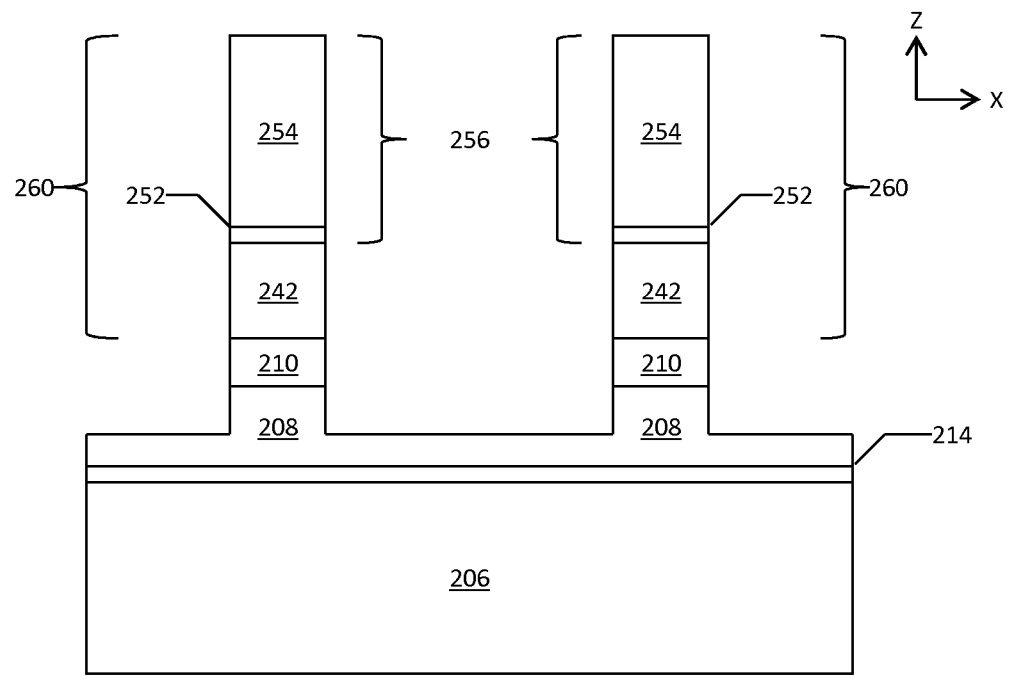
FIG. 8 is a cross-sectional view of the structure of FIG. 6 through line A-A' in accordance with one embodiment.
Figure 9:
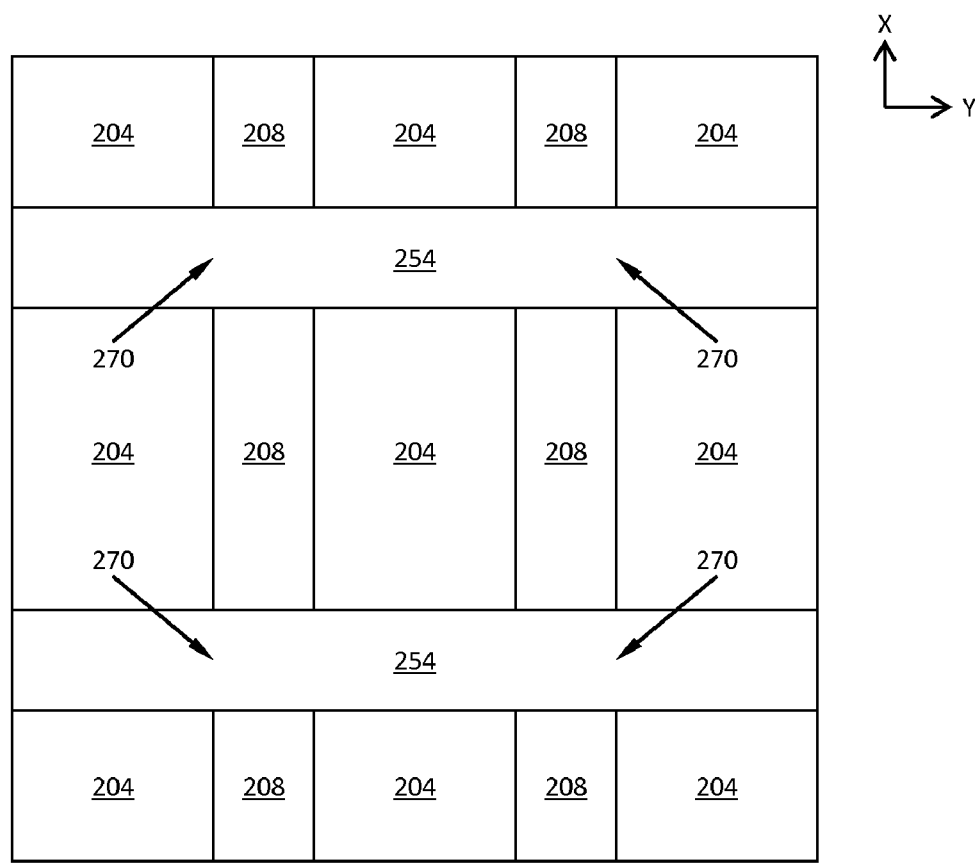
FIG. 9 is a top view of the structures of FIGS. 7-8 in accordance with various embodiments.
Figure 10:
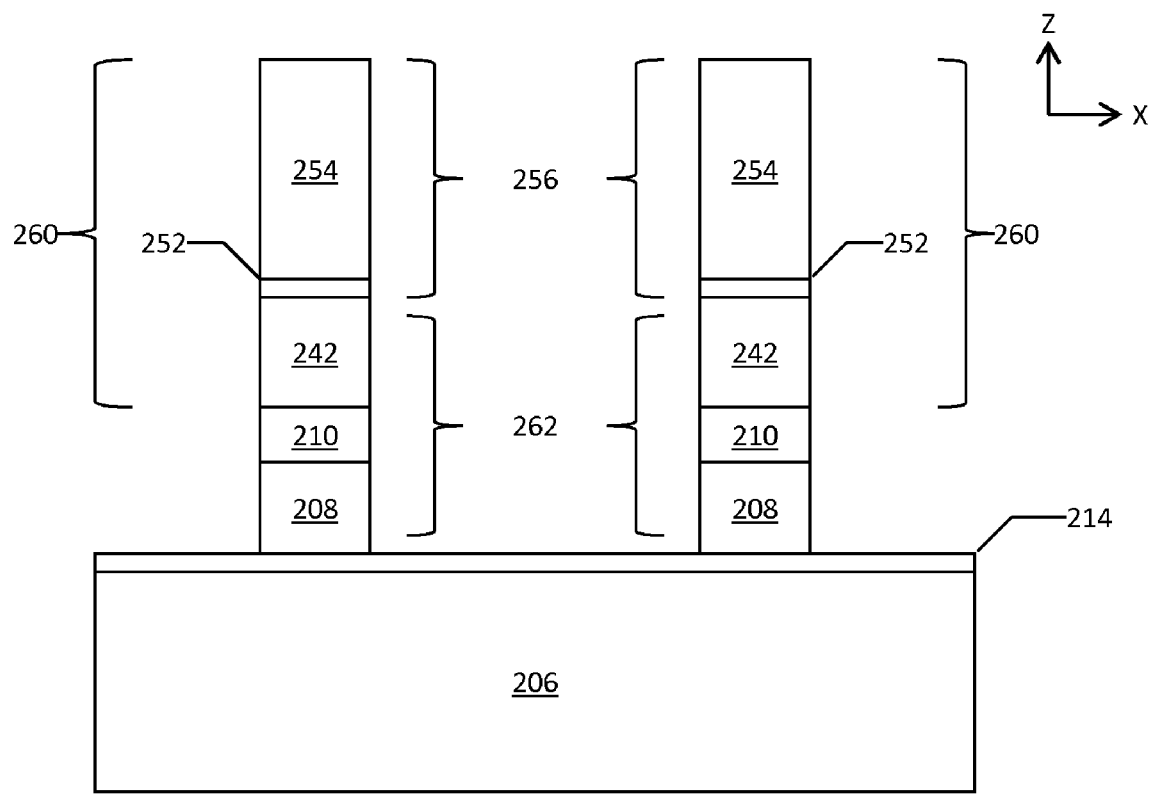
FIG. 10 is a cross-sectional view of the structure of FIG. 6 through line A-A' in accordance with one embodiment.
Figure 11:
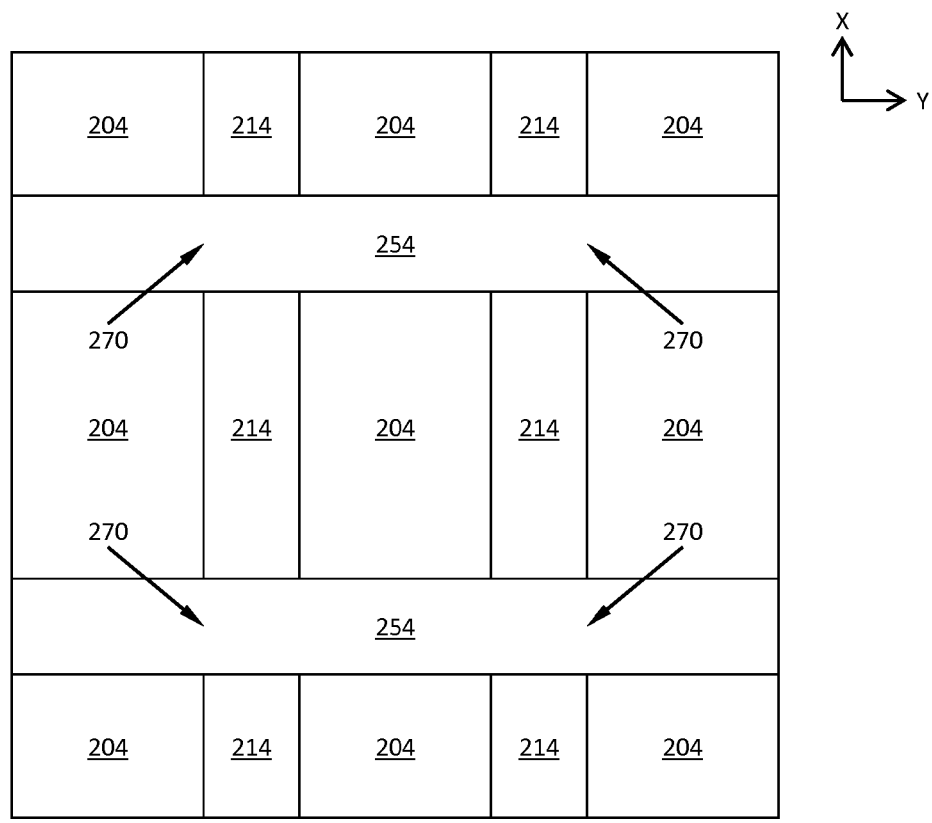
FIG. 11 is a top view of the structure of FIG. 10 in accordance with one embodiment.

FIGS. 7, 8 and 10 show cross-sections of the structure of FIG. 6 through line A-A' according to various embodiments. FIGS. 9 and 11 show top views of the various embodiments. It should be noted that although not shown in these figures, the structure of FIG. 6 may be filled with an insulator in open or unfilled areas, for example, such as between column stack structures 256 or 260 so as to reduce current leakage. As a non-limiting example, the insulator may be a dielectric material.

FIG. 7 shows a cross-section of the structure of FIG. 6 after column etching of chalcogenide 242 and middle electrode 210 according to one embodiment. Chalcogenide 242 may be confined to a cubical region with a smaller volume than prior to column etching. As a result, electrical current density may be preserved throughout the volume. In the embodiment of FIG. 7, chalcogenide 208 is not etched in a column-wise direction. The column-etch process may be extended to etch into chalcogenide 208, as shown in FIG. 8 in an embodiment in which part of chalcogenide 208 is etched. FIG. 9 is a top view corresponding to both structures of FIGS. 7-8 in accordance with various embodiments.

By etching chalcogenide 208 in embodiments shown in FIGS. 8 and 10, current that runs through chalcogenide 208 is said to be confined. Instead of spreading out like current normally does in phase-change memory switch (PCMS) devices, the current travels mostly in the vertical direction (z direction) from the row interconnect material 206 to the column interconnect material 254. The column-etch process may extend down to the chemical barrier 214 as shown in FIG. 9 and the chemical barrier 214 may act as an etch stop. In one embodiment, current may travel through a vertical stack 262 of chalcogenide 242 (upper chalcogenide), middle electrode 210, and chalcogenide 208 (lower chalcogenide), each having been etched in one or more of row and column directions. FIG. 11 is a top view of the structure of FIG. 10 in accordance with one embodiment.

In accordance with one or more embodiments, FIGS. 9 and 11 show a portion of memory array 102. From the top views, a cross-point PCMS arrangement of rows and columns of memory array 102 include memory cells located at 270 in each of FIGS. 9 and 11. In one or more embodiments, memory cells may be stacked in the vertical direction to increase storage density.

In one or more embodiments, to increase current density during programming of the memory cell, a reduced-size contact area may be formed between a memory chalcogenide and middle electrode for current confinement. For a smaller contact area, the lateral size of the memory chalcogenide may be reduced. In one embodiment, the memory chalcogenide may be formed such that the lateral size is below critical dimension (CD). CD may be defined as the minimum feature size or a target design rule, such as, for example, in photolithography. Fabricating components below critical dimension may be referred to as "sub-critical dimension", "sub-lithographic," "sub-lithographic CD" or simply "sub-CD."

In one or more embodiments, FIGS. 12-19, FIGS. 20-24 and FIGS. 25-27 show processes of forming sub-CD chalcogenide. FIGS. 12-19 and FIGS. 25-27 illustrate how sub-CD chalcogenide may be formed at an upper location in one or more memory cells, using an additive process and a trimming process, respectively. FIGS. 20-24 illustrate a process of forming sub-CD chalcogenide at a lower location in one or more memory cells, utilizing trimming.

Figure 12:
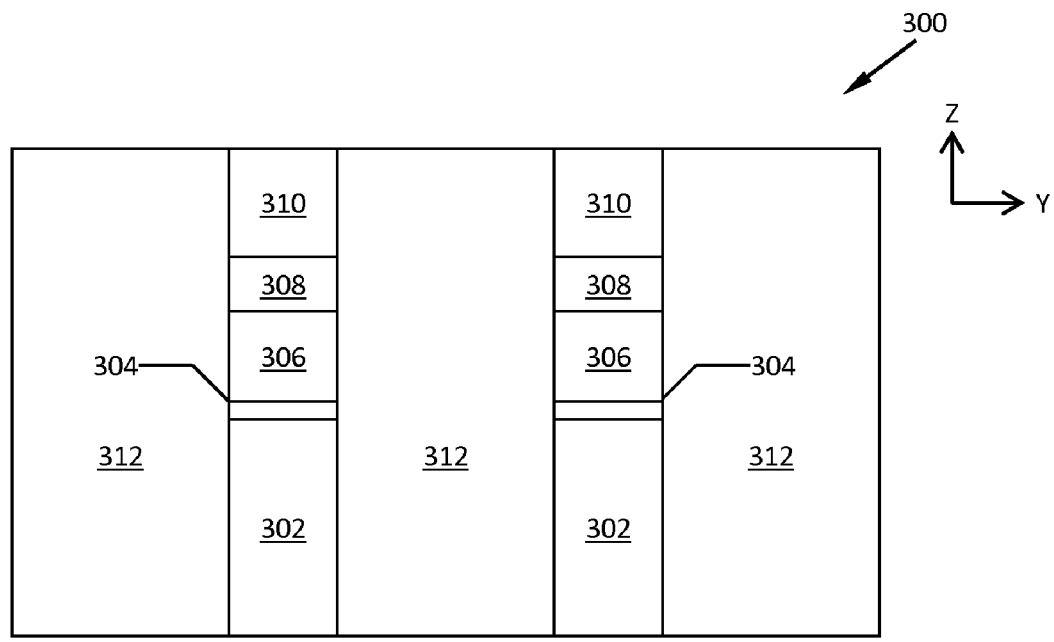
FIG. 12 is a cross-sectional view depicting an intermediate structure during fabrication of a portion of a memory cell of FIG. 1 in accordance with one embodiment, including a spacer.

Referring now to FIG. 12, an intermediate structure 300 during fabrication of a portion of a memory cell of FIG. 1 in accordance with one or more embodiments is shown. In one embodiment, intermediate structure 300 may be constructed as shown and described in FIG. 2 using the same or similar processes and materials. Intermediate structure 300 may include row stack structures 301 including layers of row interconnect material 302, a chemical barrier 304, a chalcogenide 306, and a middle electrode 308. Sacrificial material 310 may be incorporated on top of row stack structures 301 and self-aligned to row stack structure 301 by patterning together. Insulator 312 may be deposited in between row stack structures 301. In one embodiment, chalcogenide 306 is switch chalcogenide.

Figure 13:
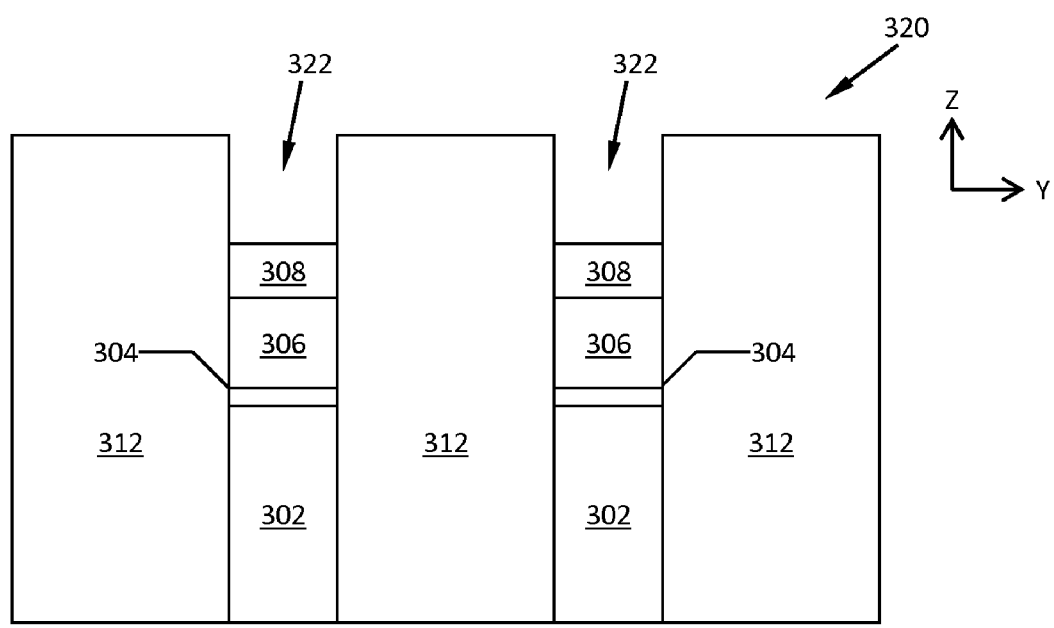
FIG. 13 is a cross-sectional view of the structure of FIG. 12 at a subsequent stage of fabrication in accordance with one embodiment.

Referring to FIG. 13, intermediate structure 320 may be constructed as shown and described in FIG. 3 using the same or similar processes and materials. Sacrificial material 310 may be selectively removed using an anisotropic etch process leaving trenches 322 self-aligned to row stack structures 301.

Figure 14:
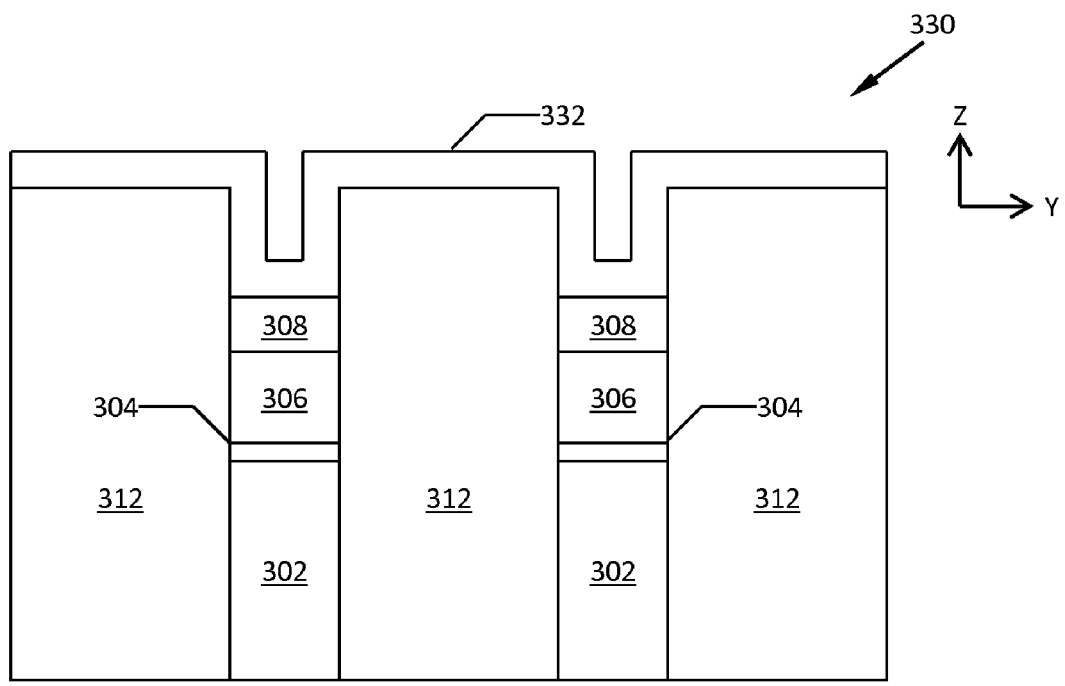
FIG. 14 is a cross-sectional view of the structure of FIG. 13 at a subsequent stage of fabrication in accordance with one embodiment.

Turning to FIG. 14, intermediate structure 330 is shown after depositing insulator 332 into the trenches 322 to create spacers inside trenches 322. Insulator 332 may be comprised of silicon dioxide, silicon nitride, silicon oxide, or combinations thereof, as non-limiting examples. The layer of insulator 332 may be a conformal layer deposited using CVD, HDPCVD or other thin-film deposition techniques. In one embodiment, the thickness of insulator 332 is in the range of about 50 Å to about 1,000 Å. In one embodiment, the thickness is on the order of about 300 Å.

Figure 15:
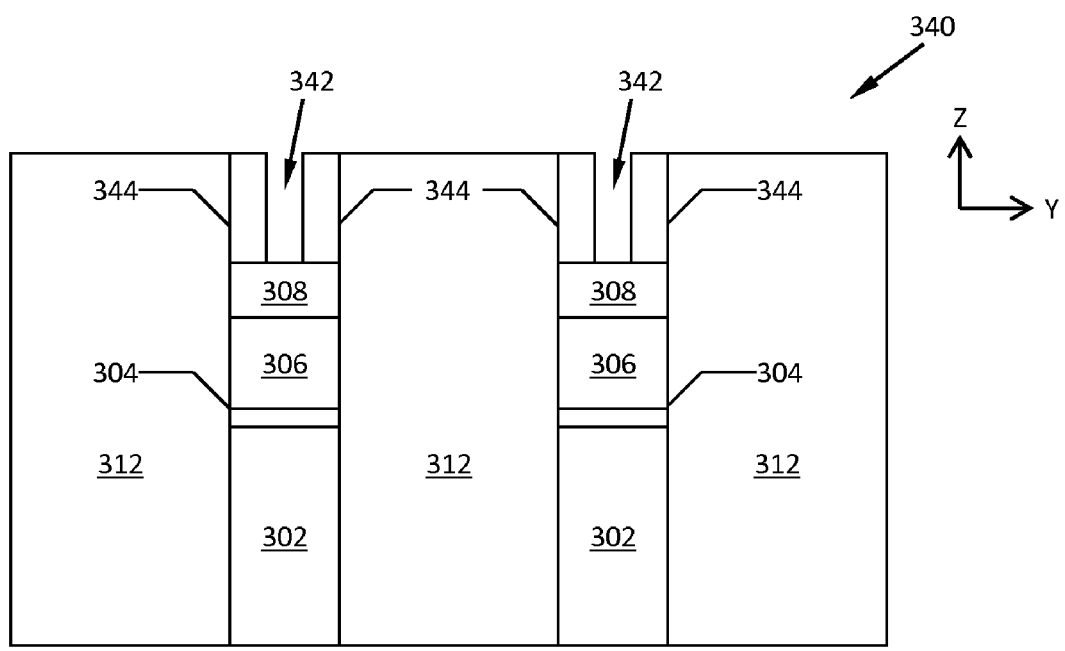
FIG. 15 is a cross-sectional view of the structure of FIG. 14 at a subsequent stage of fabrication in accordance with one embodiment.

Referring to FIG. 15, as shown by intermediate structure 340, a directional etch is applied to intermediate structure 330 to remove insulator 332 in the vertical direction. By using an etching agent that is selective, the etching agent stops at the middle electrode 308. As depicted by spacer 344, only the vertical layers of the insulator 332 lining the side walls of trenches 322 remain, and new trenches 342 are created. According to one embodiment, the trenches 342 are made to be narrow so that the memory chalcogenide that is filled in the trenches 342 may be as narrow as possible.

Figure 16:
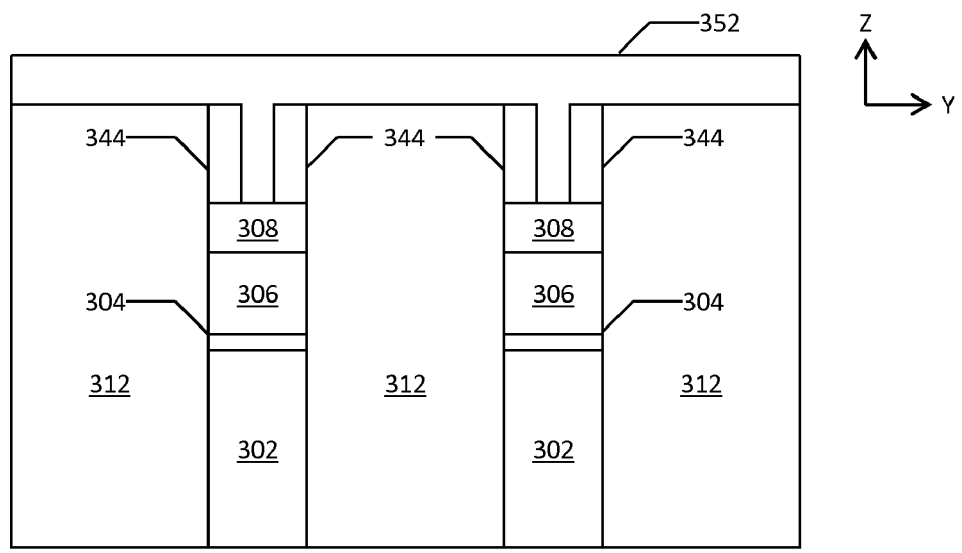
FIG. 16 is a cross-sectional view of the structure of FIG. 15 at a subsequent stage of fabrication in accordance with one embodiment.
Figure 17:
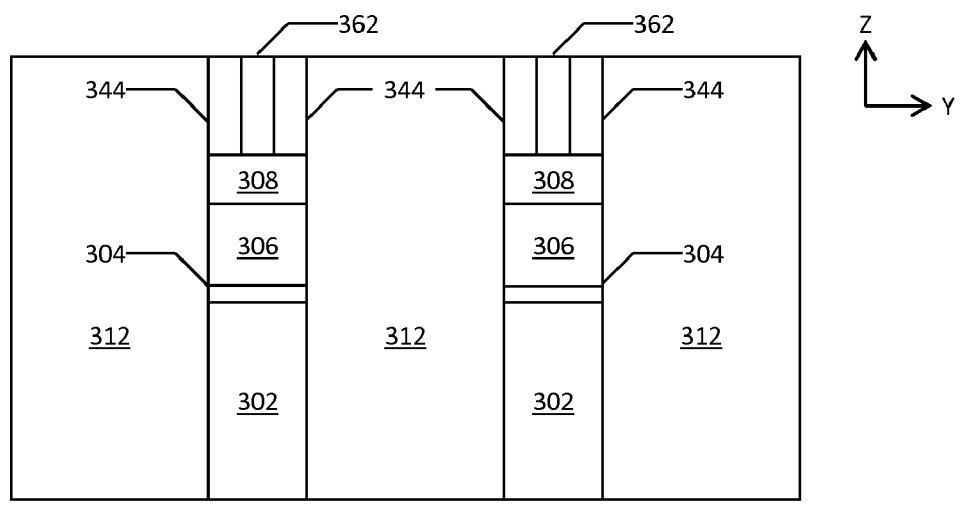
FIG. 17 is a cross-sectional view of the structure of FIG. 16 at a subsequent stage of fabrication in accordance with one embodiment.
Figure 18:
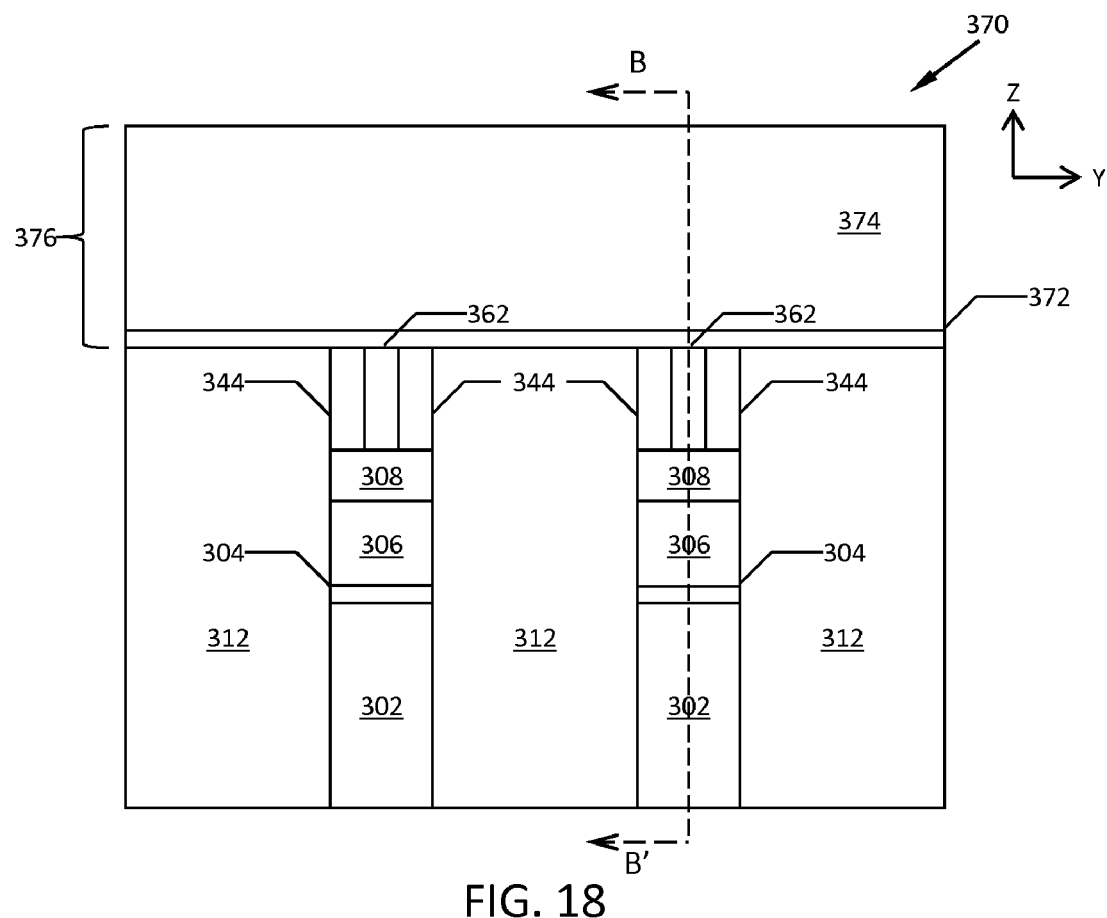
FIG. 18 is a cross-sectional view of the structure of FIG. 17 at a subsequent stage of fabrication in accordance with one embodiment.

After creating spacer 344 in the trenches 342, FIGS. 16, 17, and 18 may use the same or similar processes and materials as shown at FIGS. 4, 5, and 6, respectively. In FIG. 16, memory chalcogenide 352 may fill in the trenches 342 using CVD or HDPCVD, as an example. In one embodiment, in contrast to the embodiment shown at FIGS. 4, 5, and 6, a contact area between memory chalcogenide 352 and middle electrode 308 formed with spacers 344 is smaller and as a result, current can also be confined to a smaller volume. In FIG. 17, undesired chalcogenide may be removed by CMP, for example. Chalcogenide that is left in the trenches is depicted at 362, and may be considered sub-CD. In one embodiment, the thickness of chalcogenide 362 may be in the range of about 50 Å to about 1,000 Å. In one embodiment, the thickness is on the order of about 300 Å.

Referring to FIG. 18, once a planar surface has been obtained after CMP, a chemical barrier 372 may be deposited on top of the planar surface and a column interconnect material 374 may be deposited on top of the chemical barrier 372 to form structure 370. In one embodiment, chemical barrier 372 is optional and the column interconnect material 374 may be directly deposited onto the planarized surface. Column patterning may be done with etching in the column-wise direction (y direction), and thus creating column stack structures 376. In one embodiment, column stack structure 376 may include memory chalcogenide 362 and may be patterned as well. Additional column etching may extend to middle electrode 308.

Figure 19:
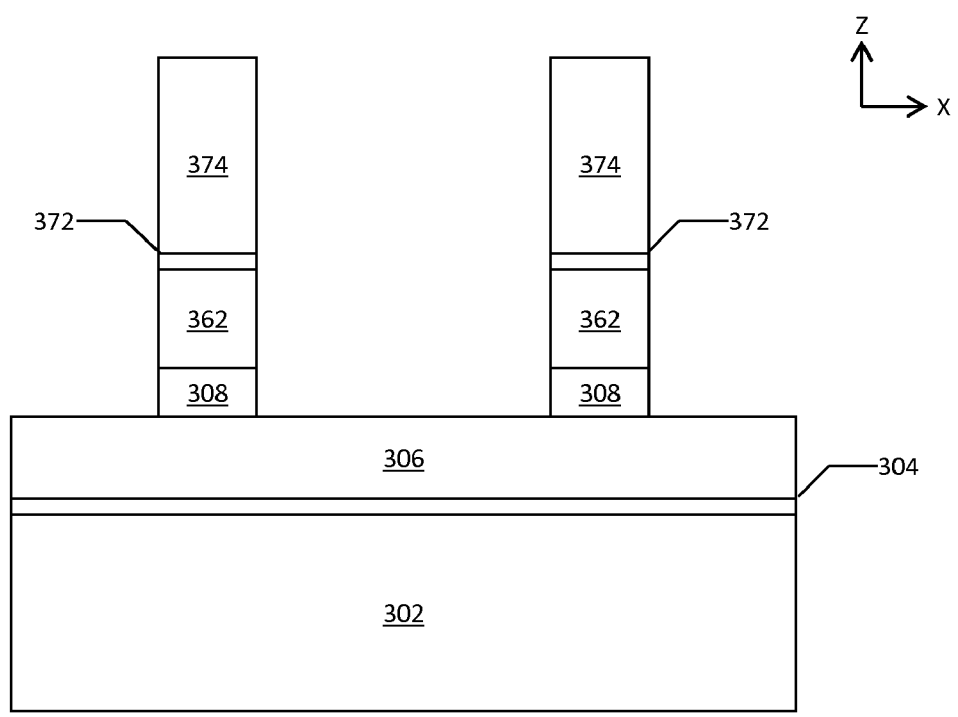
FIG. 19 is a cross-sectional view of the structure of FIG. 18 through line B-B' in accordance with one embodiment.

FIG. 19 is a cross-section of FIG. 18 taken through line B-B' of structure 370. The top view of structure 370 is shown by FIG. 9. In one embodiment, similar to structure 250 of FIG. 6, structure 370 has the option of further etching the switch chalcogenide 306 either partially, as shown in top view FIG. 9 and cross-section FIG. 8, or completely, as shown in top view FIG. 11.

Figure 20:
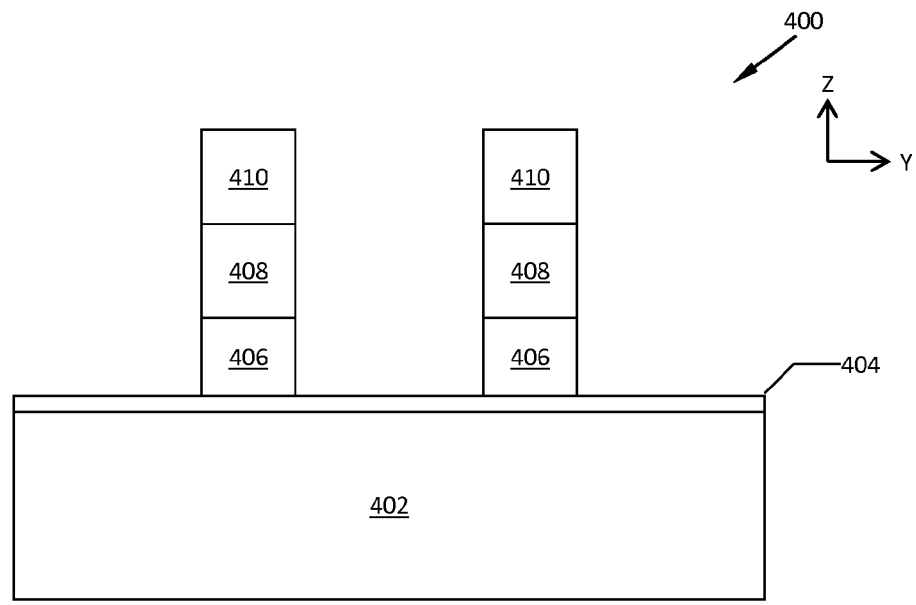
FIG. 20 is a cross-sectional view depicting an intermediate structure during fabrication of a portion of a memory cell of FIG. 1 in accordance with one embodiment, using trimming.

Turning to FIG. 20, a trimming method for constructing a sub-CD memory chalcogenide is shown with an intermediate structure 400 in the midst of a row stack structure patterning process. Intermediate structure 400 may include an interconnect material 402 and a chemical barrier 404 overlying interconnect material 402, which have not been etched in the row direction (x direction); hence, row stack structure is not yet defined. Chemical barrier 404 may be an optional layer. Intermediate structure 400 further includes a layer of memory chalcogenide 406 on top of the chemical barrier 404, middle electrode 408 on top of memory chalcogenide 406, and insulator 410 on top of middle electrode 408, which have gone through row patterning. As an etch mask, insulator 410 may include a dielectric material,. such as silicon dioxide or a combination of several insulating films. During patterning, memory chalcogenide 406 is etched and the sidewalls are exposed.

Figure 21:
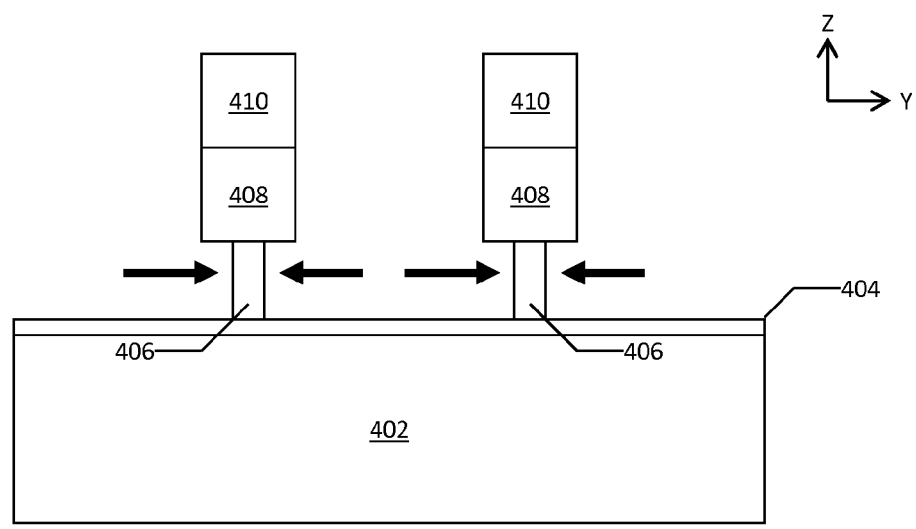
FIG. 21 is a cross-sectional view of the structure of FIG. 20 at a subsequent stage of fabrication in accordance with one embodiment.

Referring now to FIG. 21, the patterning performed on memory chalcogenide 406 has allowed lateral access to memory chalcogenide 406. Using selective etching, memory chalcogenide 406 may be etched laterally, as shown by the arrows. In one embodiment, vacuum conditions may be changed in the selective etching process in order to cut memory chalcogenide 406. Chemical barrier 404 is not etched at this stage.

Figure 22:
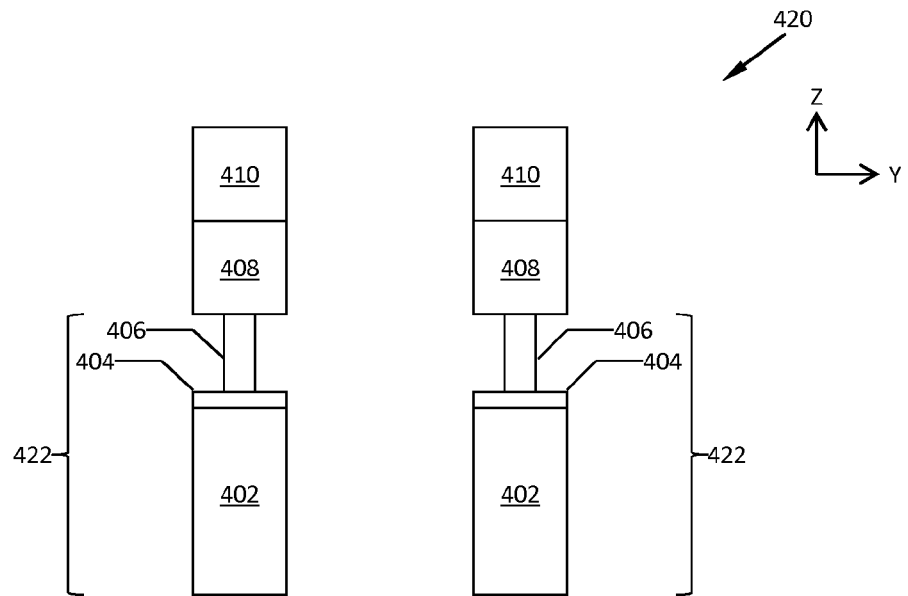
FIG. 22 is a cross-sectional view of the structure of FIG. 21 at a subsequent stage of fabrication in accordance with one embodiment.

In FIG. 22, the rest of row stack structure 422 including chemical barrier 404 and row interconnect material 402 is patterned. The row stack structure 422 and layers of middle electrode 408 and insulator 410 are shown as an intermediate structure 420.

Figure 23:
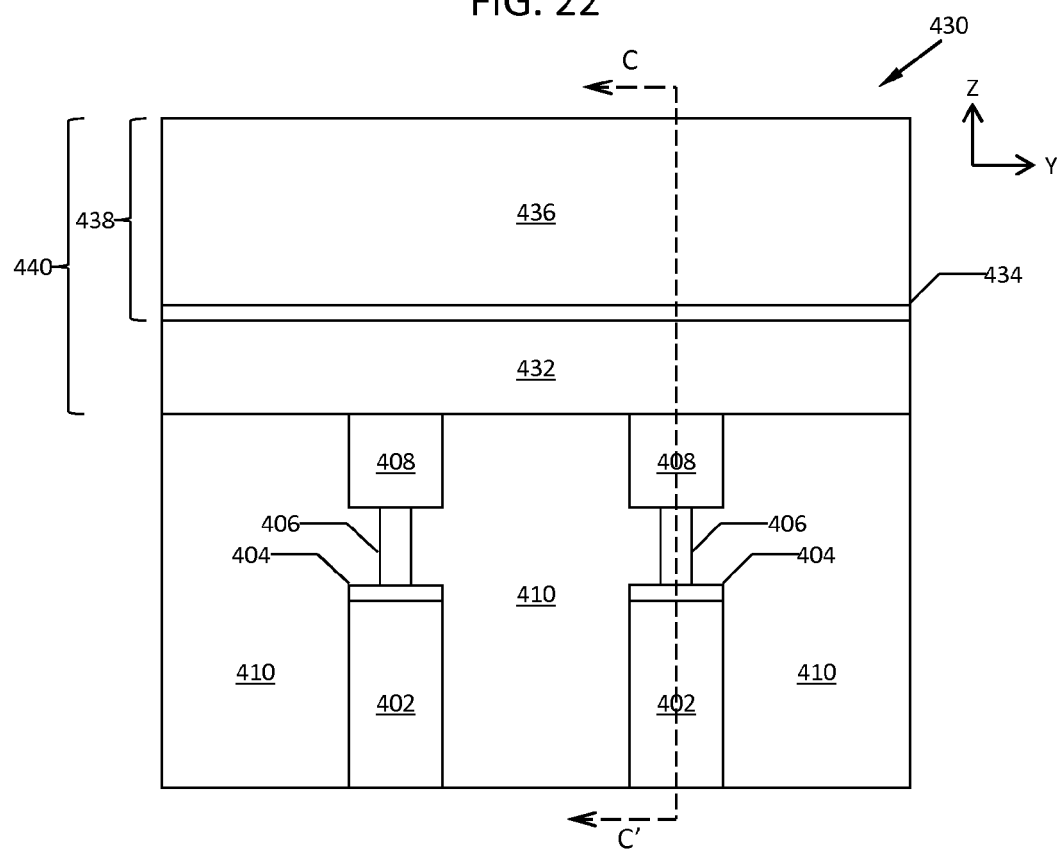
FIG. 23 is a cross-sectional view of the structure of FIG. 22 at a subsequent stage of fabrication in accordance with one embodiment.

In FIG. 23, according to one embodiment, cross-point PCMS cell process may occur, as described above, to construct structure 430. In one embodiment, intermediate structure 420 may be filled in with additional insulator 410 using CVD or HDPCVD, for example. The insulator 410 may replace the space that was vacated from the lateral etching of the memory chalcogenide 406. In one embodiment, the contact area between memory chalcogenide 406 and middle electrode 408 is maintained and smaller than CD in width.

Insulator 410 may be removed from the top of intermediate structure 420, for example, using CMP or isotropic etch processes, until the layer of insulator 410 above the row stack structure 422 is removed and/or when middle electrode 408 is reached. Once the surface of intermediate structure 420 is planarized and middle electrode 408 is exposed at the surface, the process may proceed to deposition of switch chalcogenide 432. Additionally, an optional layer of chemical barrier 434 may be deposited on top of switch chalcogenide 432. Column interconnect material 436 may be formed on top of chemical barrier 434. If chemical barrier 434 is not used, column interconnect material 436 may be deposited on top of switch chalcogenide 432. Column stack structures 438 and 440 may be patterned in a column-wise direction. Middle electrode 408 may be patterned with column stack structures 438 and 440.

Figure 24:
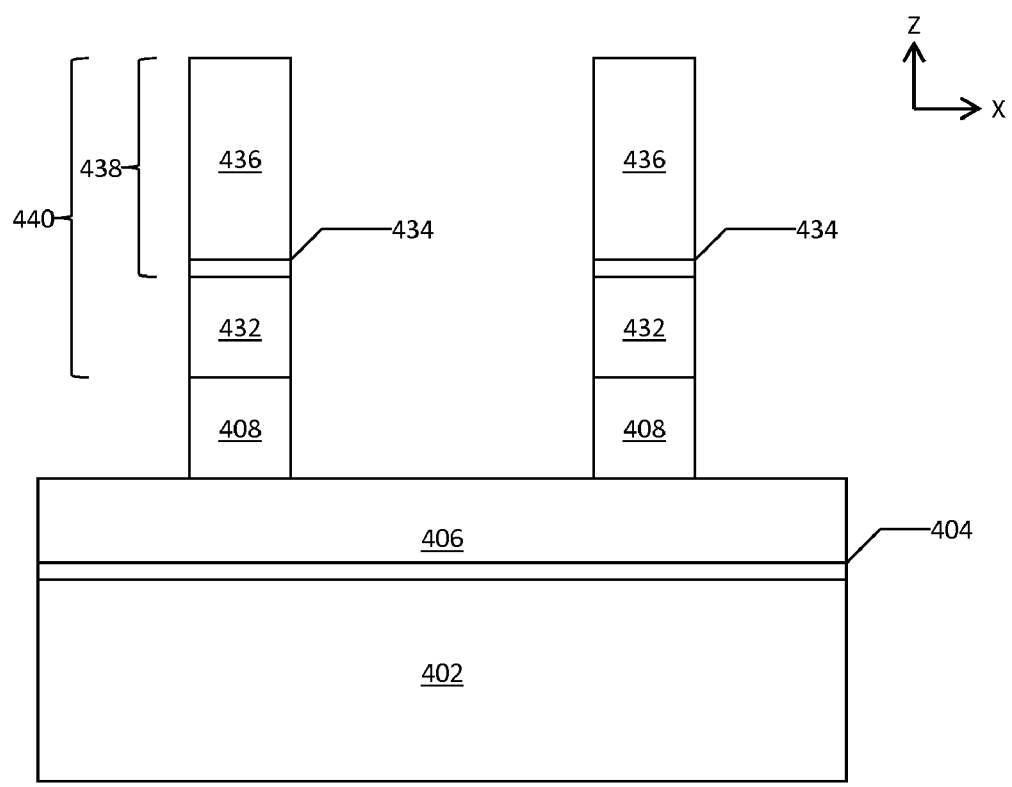
FIG. 24 is a cross-sectional view of the structure of FIG. 23 through line C-C' in accordance with one embodiment.

FIG. 24 further shows a cross-section of structure 430, taken through line C-C', in accordance with one embodiment. The top view of structure 430 is shown by FIG. 9. In one embodiment, similar to structure 250 of FIG. 6, structure 430 has the option of further etching the memory chalcogenide 406 either partially, as shown in top view FIG. 9 and similar to cross-section FIG. 8, or completely (such as down to expose chemical barrier 434) as shown in top view FIG. 11.

Figure 25:
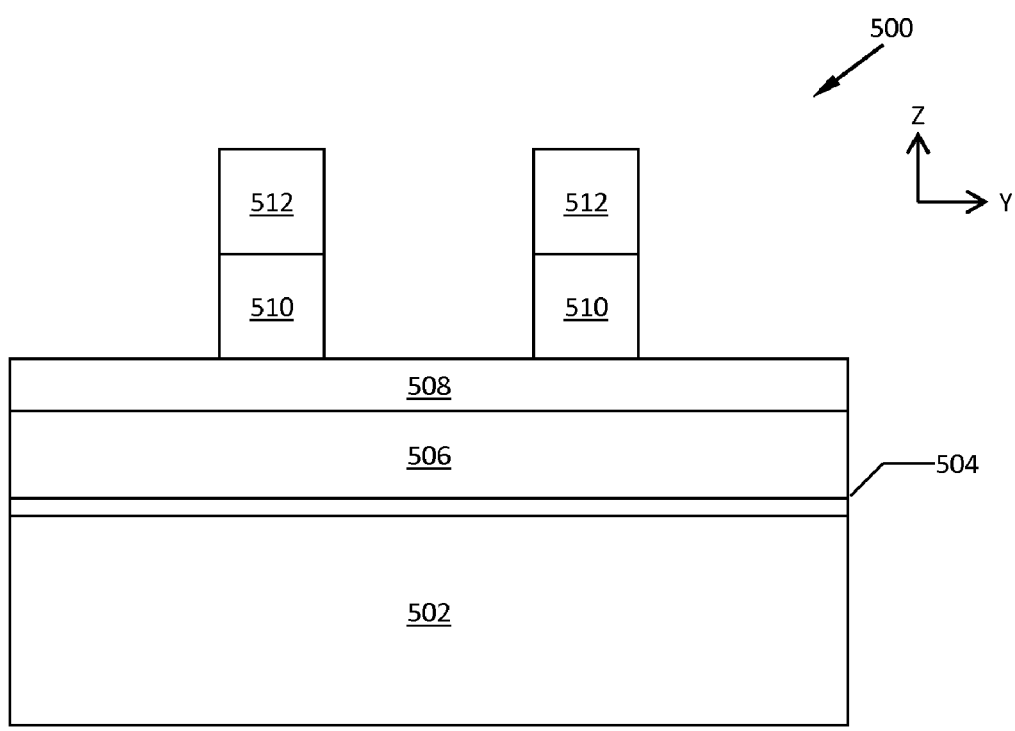
FIG. 25 is a cross-sectional view depicting an intermediate structure during fabrication of a portion of a memory cell of FIG. 1 in accordance with one embodiment, using trimming.
Figure 26:
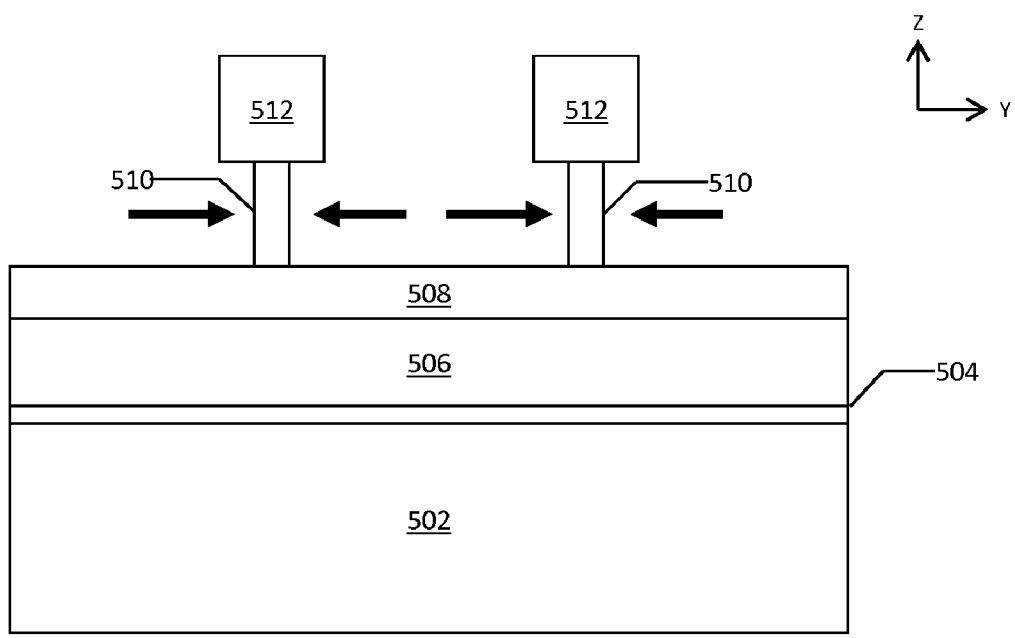
FIG. 26 is a cross-sectional view of the structure of FIG. 25 at a subsequent stage of fabrication in accordance with one embodiment.
Figure 27:
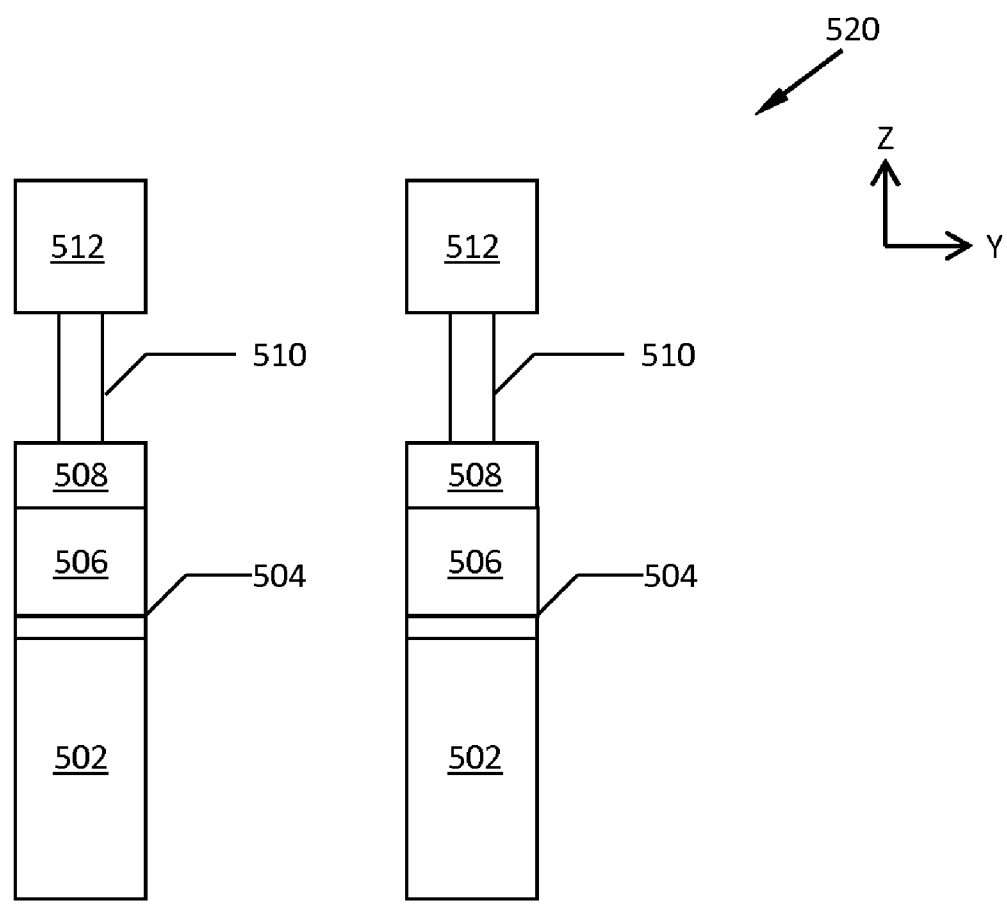
FIG. 27 is a cross-sectional view of the structure of FIG. 26 at a subsequent stage of fabrication in accordance with one embodiment.

Referring to FIGS. 25-27, an alternate method of constructing structure 370 of FIG. 18, in which memory chalcogenide is sub-CD, is shown using trimming. Similar to FIG. 18, an intermediate structure 500 may include a row interconnect material 502, an optional layer of chemical barrier 504, switch chalcogenide 506, middle electrode 508, memory chalcogenide 510, and insulator 512. During a row-patterning process, memory chalcogenide 510 may be etched and the sidewalls are exposed. Both memory and switch chalcogenides are present in a row stack structure in one embodiment. With a chemically selective etch, memory chalcogenide 510 may be etched laterally, as indicated by the arrows, according to one embodiment. The rest of the row stack structure 520 may be etched vertically. Similar to FIG. 23, a cross-point PCMS cell process including insulator fill and column patterning, as described above, may occur following etching of the rest of row stack structure 520 to construct structure 370 of FIG. 18.

Figure 35:
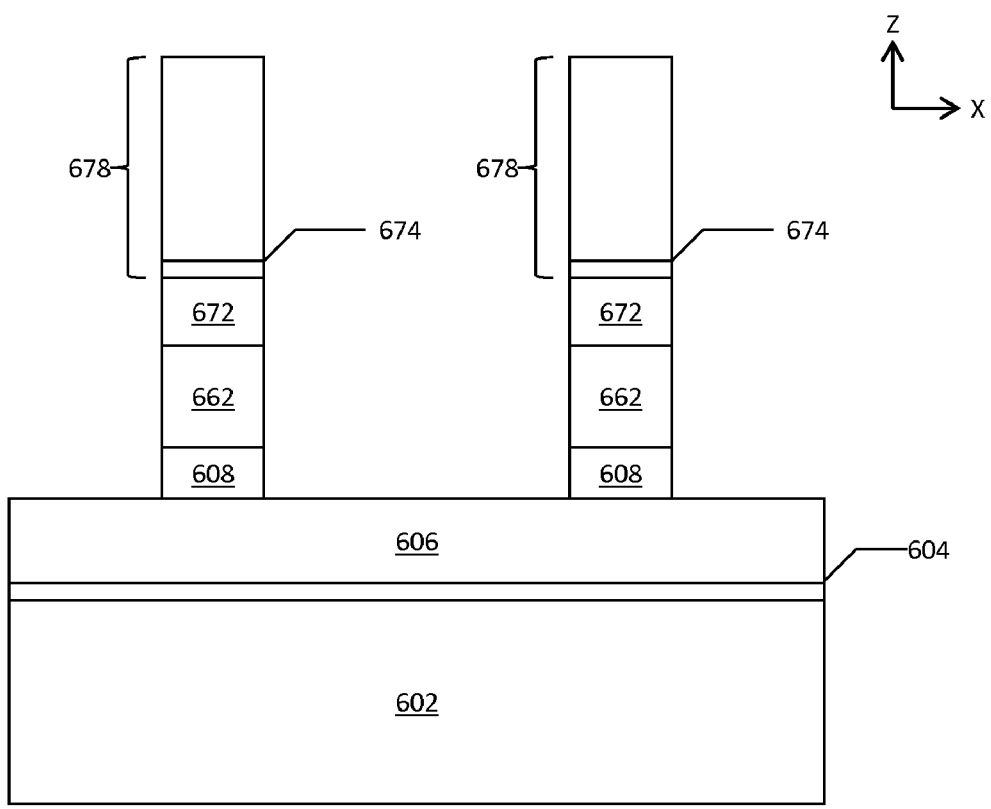
FIG. 35 is a cross-sectional view of the structure of FIG. 34 through line D-D' in accordance with one embodiment.
Figure 36:
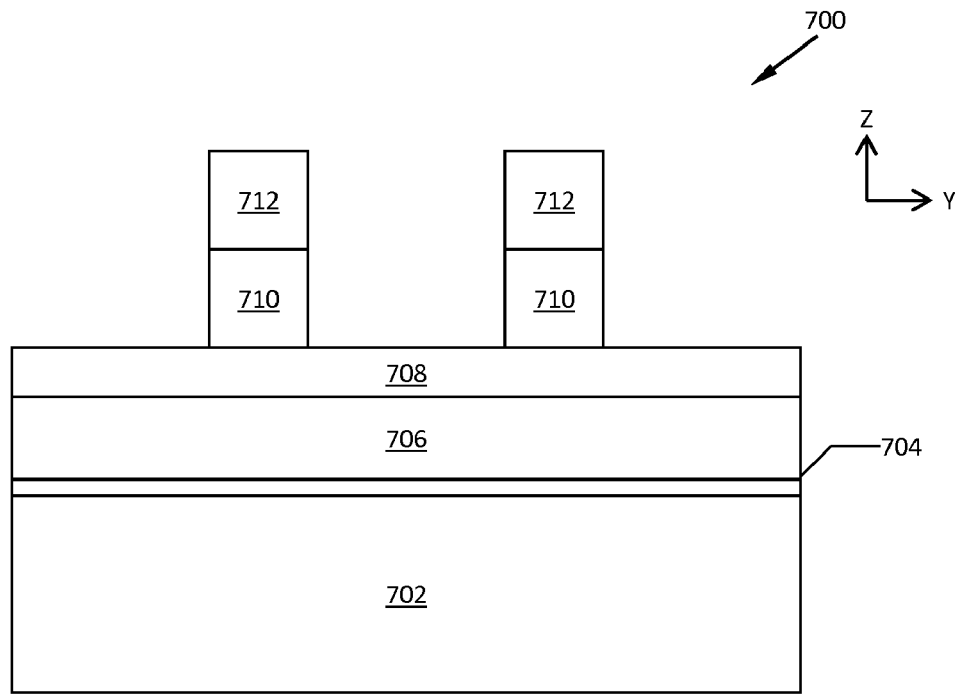
FIG. 36 is a cross-sectional view depicting an intermediate structure during fabrication of a portion of a memory cell of FIG. 1 in accordance with one embodiment, using trimming.
Figure 37:
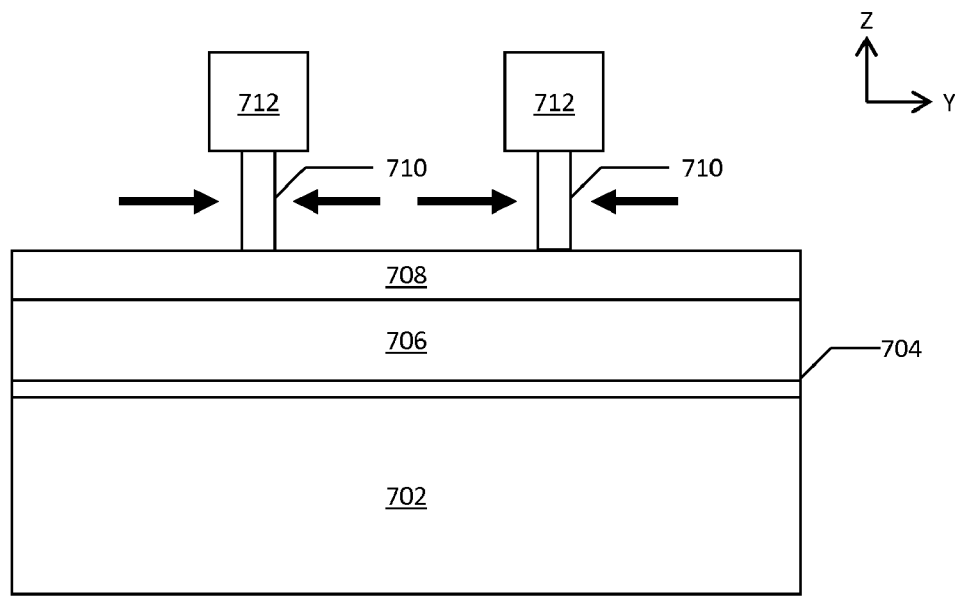
FIG. 37 is a cross-sectional view of the structure of FIG. 36 at a subsequent stage of fabrication in accordance with one embodiment.
Figure 38:
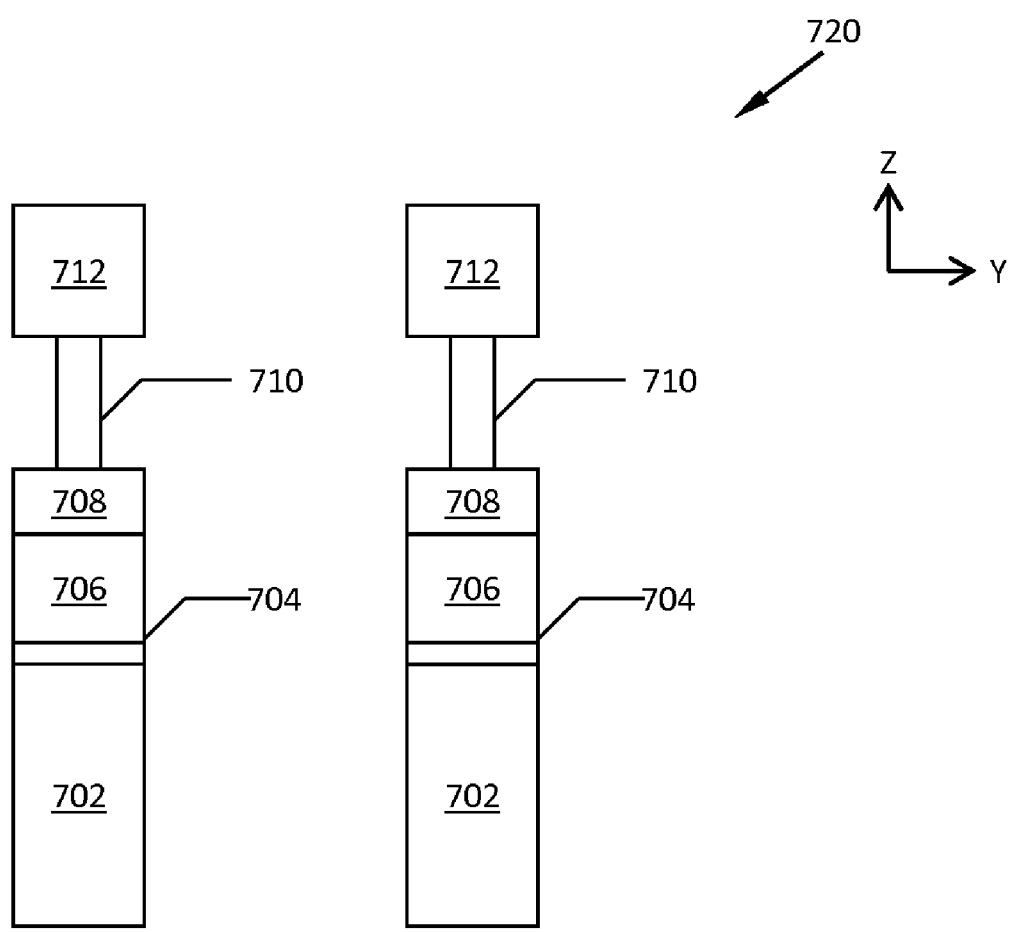
FIG. 38 is a cross-sectional view of the structure of FIG. 37 at a subsequent stage of fabrication in accordance with one embodiment.
Figure 39:
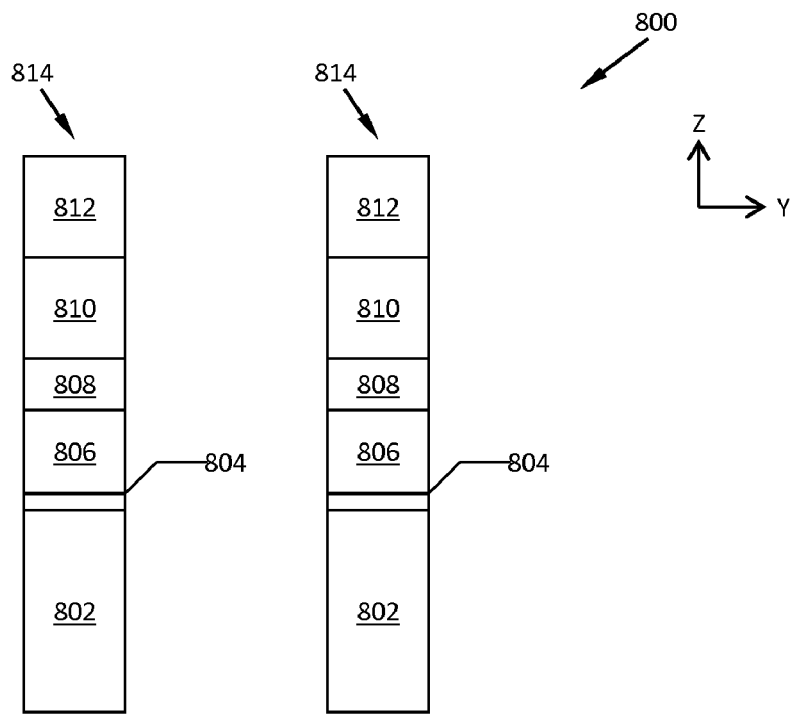
FIG. 39 is a cross-sectional view depicting an intermediate structure during fabrication of a portion of a memory cell of FIG. 1 in accordance with one embodiment, using over-etching.
Figure 40:
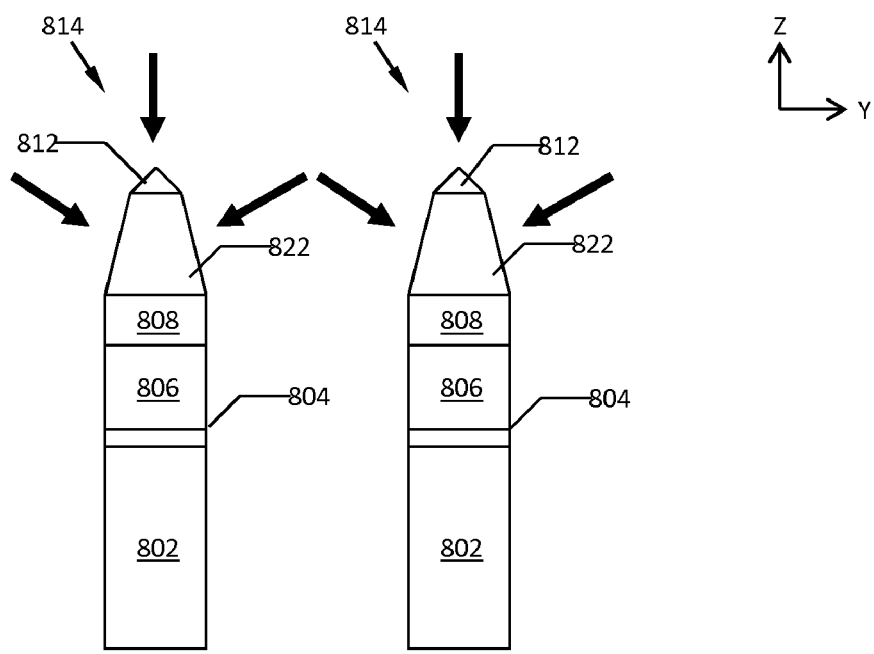
FIG. 40 is a cross-sectional view of the structure of FIG. 39 at a subsequent stage of fabrication in accordance with one embodiment.
Figure 41:
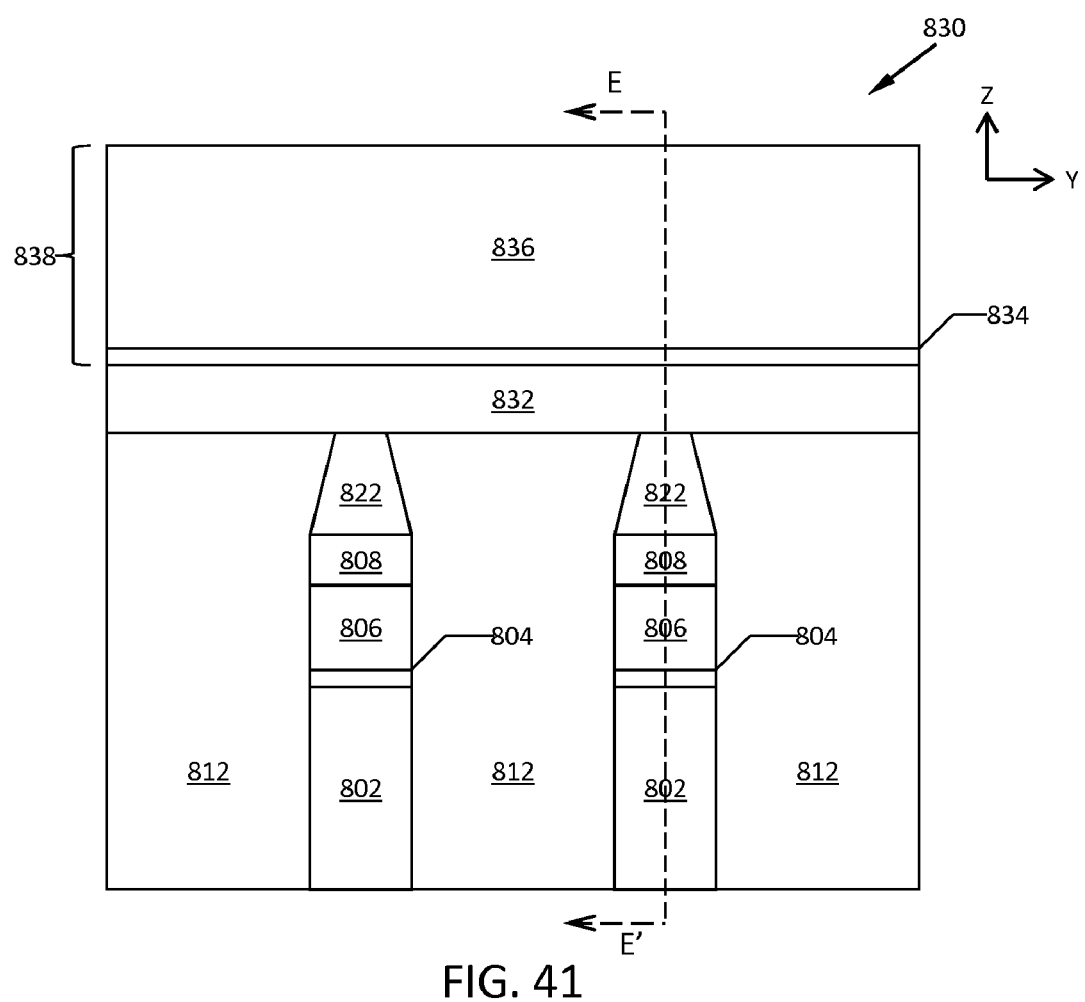
FIG. 41 is a cross-sectional view of the structure of FIG. 40 at a subsequent stage of fabrication in accordance with one embodiment.

In one or more embodiments, FIGS. 28-35, FIGS. 36-38 and FIGS. 39-41 show processes of forming sub-CD middle electrode heaters. FIGS. 28-35 may use an additive process with a damascene approach to forming sub-CD middle electrode heaters. FIGS. 36-38 may use a trimming process to form the heaters. FIGS. 39-41 show another trimming process to form sub-CD heaters. Middle electrode heaters may also be referred to as "heaters" and "heater electrodes".

In general, current flow between row interconnect material and column interconnect material results in electrical resistance heat developed by the heater electrode that heats memory chalcogenide adjacent to the heater electrode. As mentioned above, when memory chalcogenide is heated to a relatively higher temperature, the memory chalcogenide may amorphosize (set to "0"). When memory chalcogenide is heated to a relatively lower temperature, the memory chalcogenide may crystallize (set to "1"). In one or more embodiments, when using a sub-CD heater to heat the memory chalcogenide, a higher current density and increased uniformity of thermal profile within the memory chalcogenide may be achieved.

Figure 28:
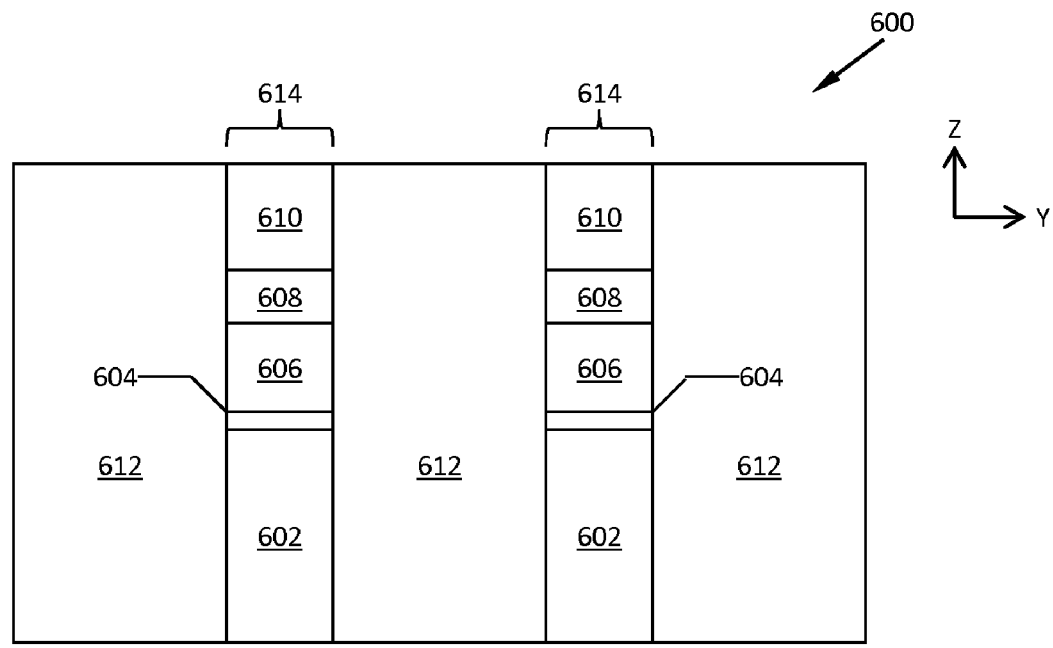
FIG. 28 is a cross-sectional view depicting an intermediate structure during fabrication of a portion of a memory cell of FIG. 1 in accordance with one embodiment, including a spacer.
Figure 29:
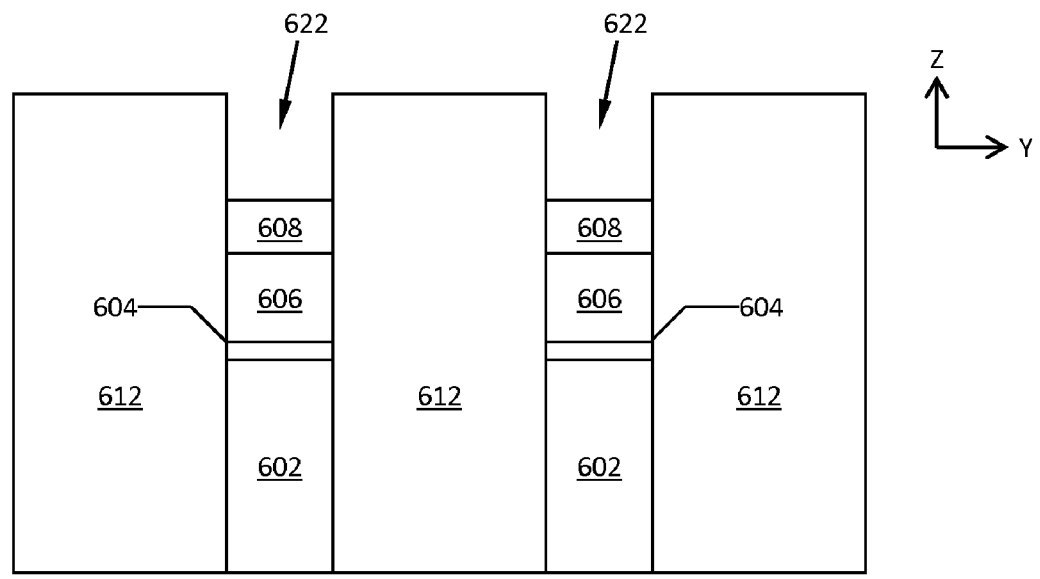
FIG. 29 is a cross-sectional view of the structure of FIG. 28 at a subsequent stage of fabrication in accordance with one embodiment.

In forming sub-CD heaters, FIGS. 28 and 29 may use the same or similar processes and materials as shown at FIGS. 2 and 3, respectively. FIG. 28 shows an intermediate structure 600 including patterned row stack structures 614 with layers of row interconnect material 602, optional chemical barrier 604, switch chalcogenide 606, and middle electrode 608. Sacrificial material 610 overlying middle electrode 608 is also patterned. Insulator 612 may fill in between the patterned row stack structures 614 to create intermediate structure 600. At FIG. 29, using an anisotropic etch process, sacrificial material 610 is removed from intermediate structure 600 leaving trenches 622 self-aligned to row stack structures 614.

Figure 30:
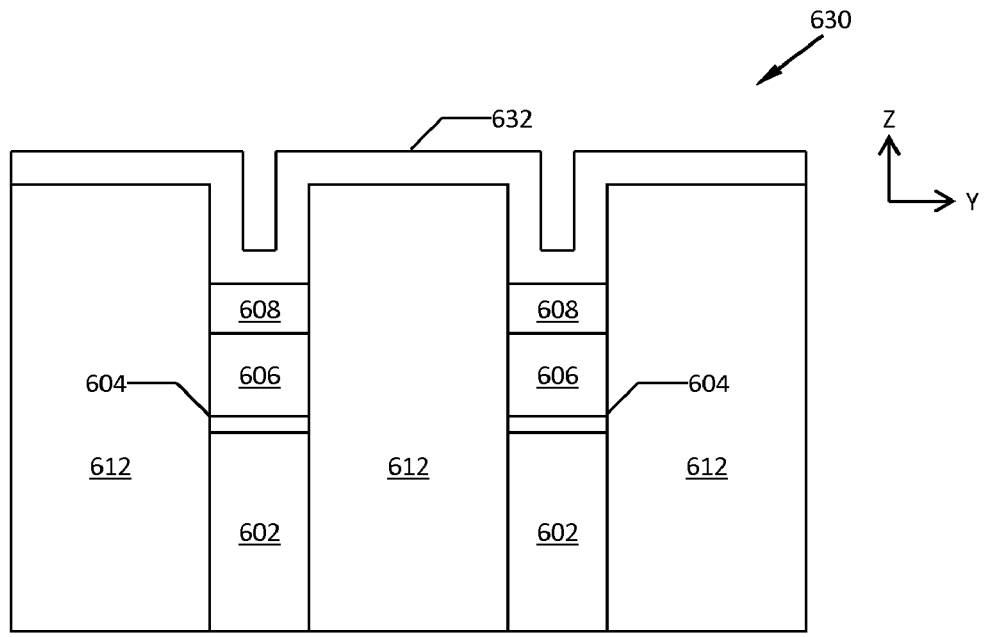
FIG. 30 is a cross-sectional view of the structure of FIG. 29 at a subsequent stage of fabrication in accordance with one embodiment.
Figure 31:
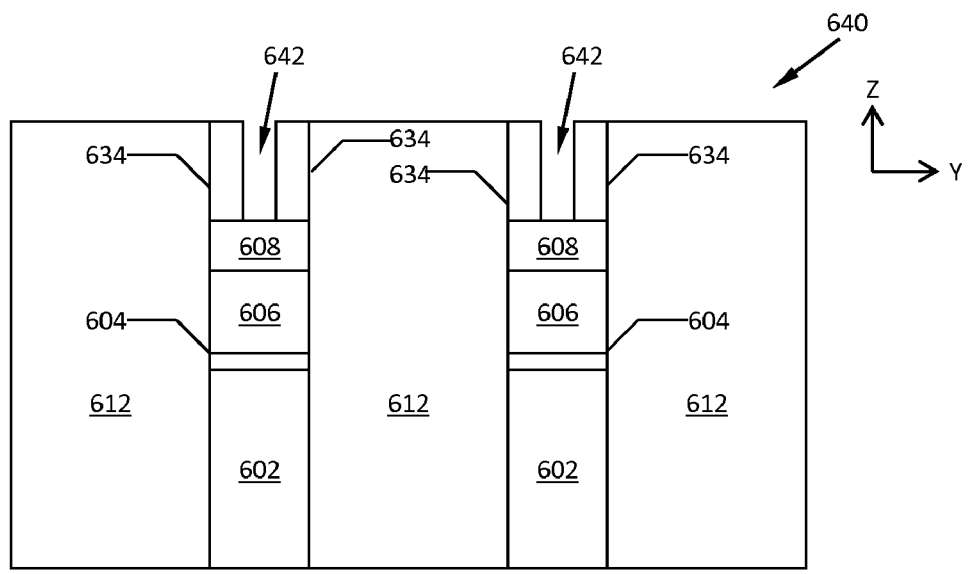
FIG. 31 is a cross-sectional view of the structure of FIG. 30 at a subsequent stage of fabrication in accordance with one embodiment.

Turning to FIGS. 30 and 31, in the formation of spacers in trenches 622, FIGS. 30 and 31 may use the same or similar processes and materials as shown at FIGS. 14 and 15, respectively. At FIG. 30, a spacer 632 may be deposited in trenches 622 and above insulator 612 forming an intermediate structure 630. FIG. 31 shows an intermediate structure 640 after directional etching of intermediate structure 630 according to one embodiment. Anisotropic etching may remove a portion of the spacer 632 that is above the middle electrode 608. A selective etching agent may remove spacer 632 without removing middle electrode 608. Spacers 634 remain and create new trenches 642.

Figure 32:
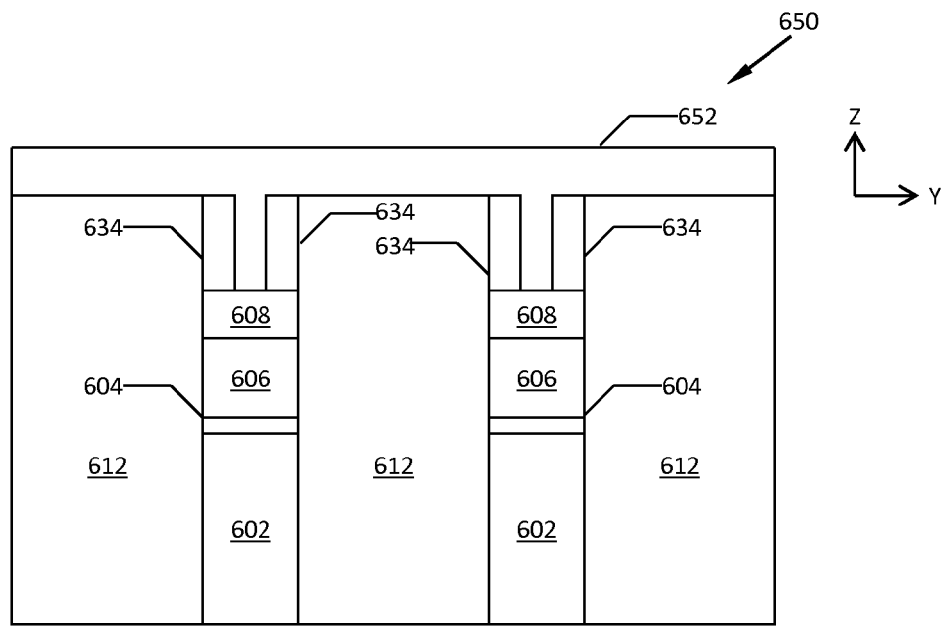
FIG. 32 is a cross-sectional view of the structure of FIG. 31 at a subsequent stage of fabrication in accordance with one embodiment.

Referring to FIG. 32, intermediate structure 650 is shown after forming a heater electrode 652 on top of intermediate structure 640 in accordance with one embodiment. As non-limiting examples, the heater electrode 652 may be TiSiN, Ti, TiN, TiW, C, SiC, TiAlN, polycrystalline silicon, TaN, other suitable conductors, and combinations thereof. The heater electrode 652 may be a conformal layer introduced to the top of intermediate structure 640 using, for example, CVD or HDPCVD. In trench 642, a contact area is formed between heater electrode 652 and middle electrode 608 resulting in a contact area that is sub-CD.

Figure 33:
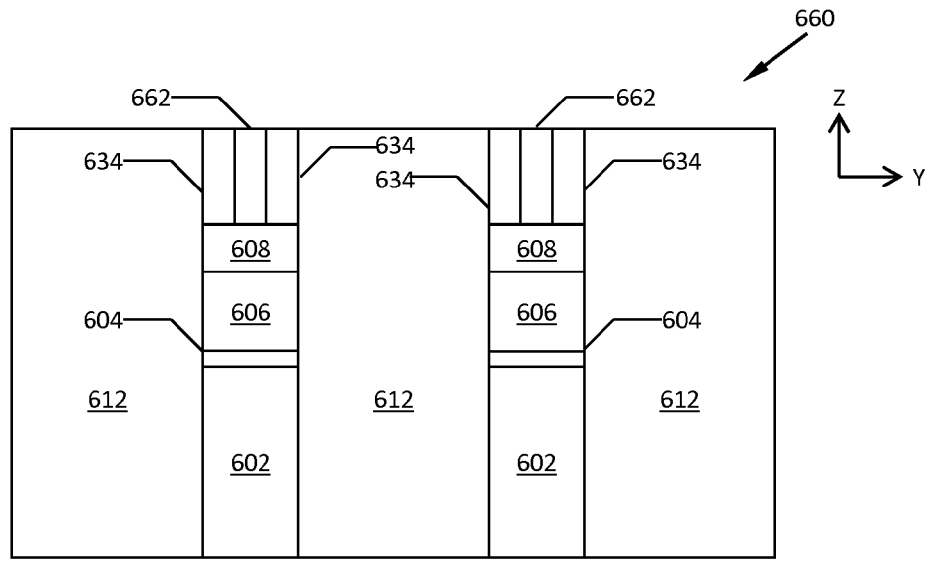
FIG. 33 is a cross-sectional view of the structure of FIG. 32 at a subsequent stage of fabrication in accordance with one embodiment.

Referring to FIG. 33, in accordance with one embodiment, an intermediate structure 660 is formed after removing excess heater electrode 652. In one embodiment, heater electrode 652 may be removed by CMP or isotropic etch. Heater electrode 652 that is left in the trenches 642 is depicted at 662. In one embodiment, the thickness of heater electrode 662 may be in the range of about 50 Å to about 1,000 Å. In one embodiment, the thickness is on the order of about 300 Å.

Figure 34:
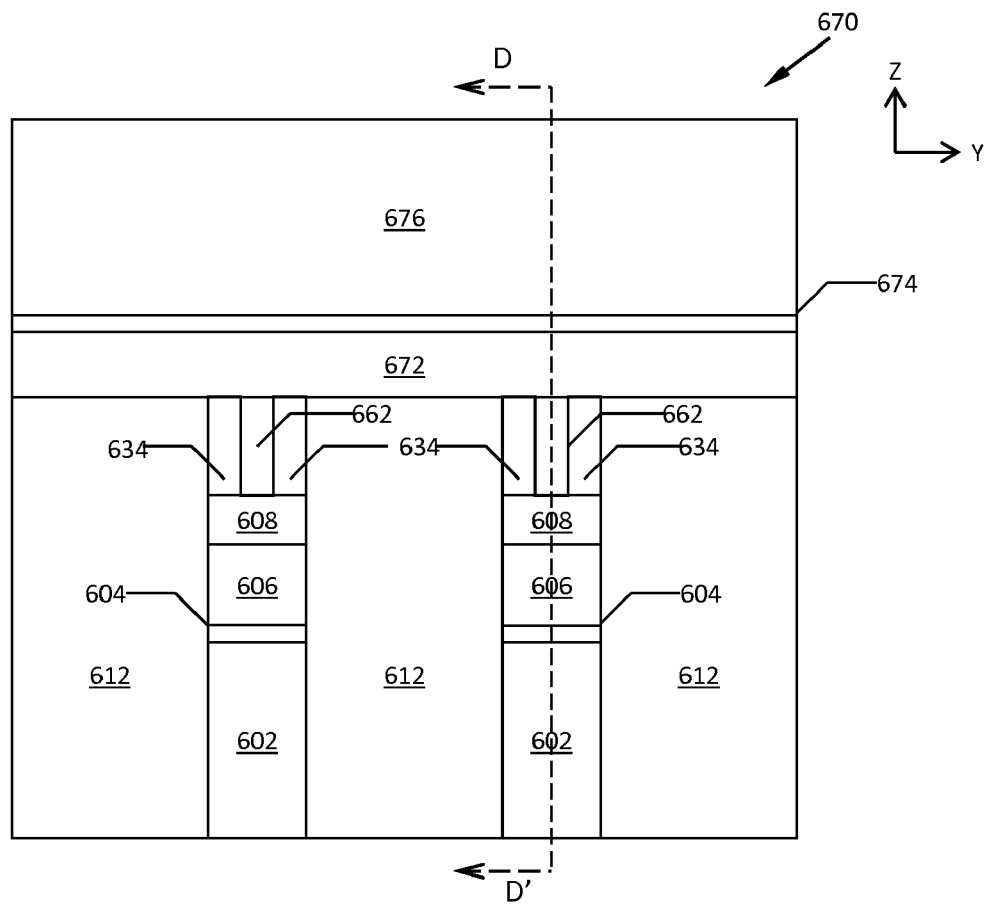
FIG. 34 is a cross-sectional view of the structure of FIG. 33 at a subsequent stage of fabrication in accordance with one embodiment.

Referring to FIG. 34, once a planar surface has been obtained, memory chalcogenide 672, chemical barrier 674, and column interconnect material 676 may be deposited to the planar surface to form structure 670. In one embodiment, chemical barrier 674 is optional and the column interconnect material 676 may be directly deposited onto memory chalcogenide 672. Column patterning may be done with anisotropic etching in the column-wise direction, and thus creating column stack structures 678, as shown in FIG. 35. Column stack structures 678 may further include memory chalcogenide 672, which may be etched column-wise. Column etching may extend down to middle electrode 608.

FIG. 35 is a cross-section of FIG. 34 taken through line D-D' of structure 670. In one embodiment, the top view of structure 670 is shown by FIG. 9. In one embodiment, similar to structure 250 of FIG. 6, structure 670 has the option of further etching the switch chalcogenide 606 either partially, as shown in top view FIG. 9 and similar to cross-section FIG. 8, or completely (such as down to expose chemical barrier 604) as shown in top view FIG. 11.

Turning to FIG. 36, a depiction of an alternate method, using trimming, to construct structure 670 using the same or similar materials of one or more embodiments above is shown. In one embodiment, an intermediate structure 700 may include a row interconnect material 702, chemical barrier 704, switch chalcogenide 706, middle electrode 708, heater electrode 710, and insulator 712. Chemical barrier 704 may be optional in one embodiment. During a row-patterning process, heater electrode 710 may be etched and the sidewalls are exposed. In FIG. 37, a chemically selective etch may cut heater electrode 710 laterally, as indicated by the arrows, according to one embodiment. Referring to FIG. 38, row patterning may continue after etching heater electrode 710 so that a row stack structure 720 may be etched vertically. Similar to FIG. 23, a cross-point PCMS cell process including insulator fill and column patterning, as described above, may complete the trimming process of constructing structure 670.

Referring to FIG. 39, a depiction of an alternate method, using trimming, to construct an intermediate structure 800 including a sub-CD heater using the same or similar materials of one or more embodiments above, is shown. Intermediate structure 800 includes row interconnect material 802, chemical barrier 804, switch chalcogenide 806, middle electrode 808, heater electrode 810, and insulator 812. Chemical barrier 804 may be optional in one embodiment. Row patterning forms row stack structures 814 in accordance with one embodiment.

In FIG. 40, for trimming purposes, a chemical/physical isotropic etch may be used to reduce the lateral dimension of the heater electrode 810. In one embodiment, the etching creates a tapered profile on the heater electrode 810. In one embodiment, the top surface area of heater electrode 810 is smaller than the bottom surface area of heater electrode 810. As shown, heater electrode 810 has top surface area at sub-CD while the bottom surface area is at CD. A portion of insulator 812 remains on top of heater electrode 810.

Referring to FIG. 41, additional insulator 812 may be filled in between the row stack structures 814. After filling in, insulator 812 may be removed from the top of intermediate structure 830, for example, using CMP or isotropic etch processes, until the insulator 812 above the row stack structures 814 are removed and/or when heater electrodes 822 are reached. Once the surface of intermediate structure 830 is planarized and heater electrode 822 is exposed at the surface, the process may proceed to deposition of memory chalcogenide 832. Additionally, an optional layer of chemical barrier 834 may be deposited on top of memory chalcogenide 832. Column interconnect material 836 may be formed on top of chemical barrier 834. If chemical barrier 834 is not used, column interconnect material 836 may be deposited on top of memory chalcogenide 832. Column stack structure 838 may be patterned in a column-wise direction. Column stack structure 838 may further include memory chalcogenide 832, which may be etched column-wise as well. Column etching may extend down to heater electrode 822 and middle electrode 808.

An identical cross-section of FIG. 41 taken through line E-E' of structure 830 is shown in FIG. 35. In one embodiment, the top view of structure 830 is shown by FIG. 9. In one embodiment, similar to structure 250 of FIG. 6, structure 830 has the option of further etching the switch chalcogenide 806 either partially, as shown in top view FIG. 9 and similar to cross-section FIG. 8, or completely (such as down to expose chemical barrier 804) as shown in top view FIG. 11.

Figure 42:
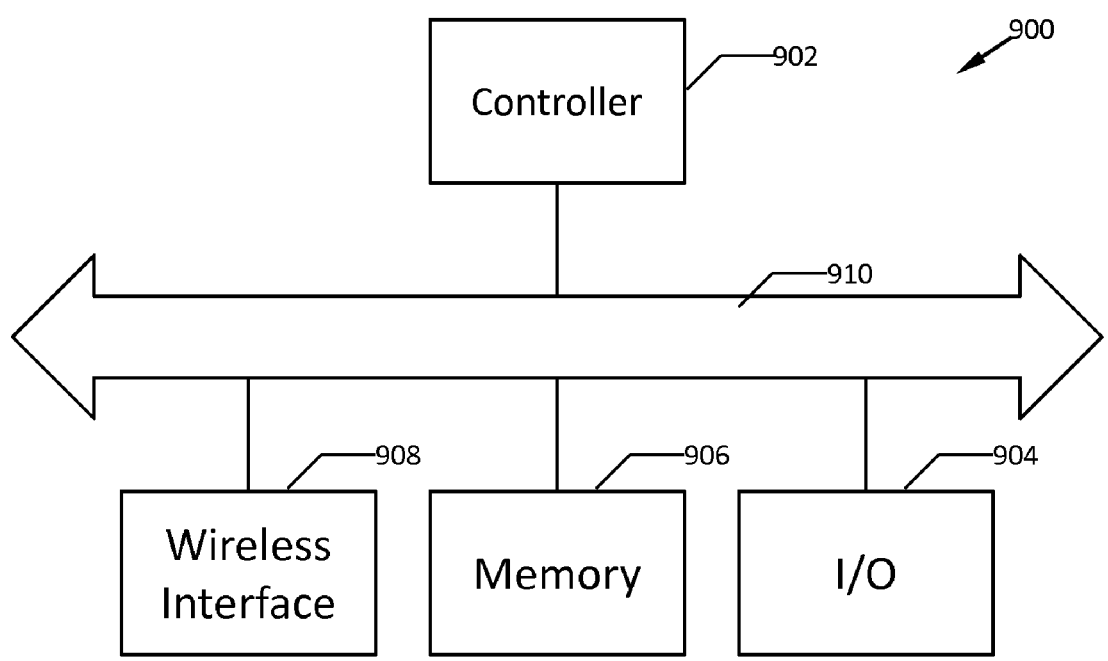
FIG. 42 is a block diagram illustrating a portion of a system in accordance with one embodiment.

Turning to FIG. 42, a portion of a system 900 in accordance with an embodiment of the present invention is described. System 900 may be used in wireless devices such as, for example, a personal digital assistant (PDA), a laptop or portable computer with wireless capability, a web tablet, a wireless telephone, a pager, an instant messaging device, a digital music player, a digital camera, or other devices that may be adapted to transmit and/or receive information wirelessly. System 900 may be used in any of the following systems: wireless personal area networks (WPAN), wireless local area networks (WLAN), and wide area networks (WAN) including, for example, 2G cellular networks, 3G networks, and 4G networks, although the scope of the claimed subject matter is not limited in this respect.

System 900 may include a controller 902, an input/output (I/O) device 904, a memory 906, and a wireless interface 908 coupled to each other via a bus 910. It should be noted that the scope of the present invention is not limited to embodiments having any or all of these components.

Controller 902 may comprise, for example, one or more microprocessors, digital signal processors, microcontrollers, or the like. Memory 906 may be used to store messages transmitted to or by system 900. Memory 906 may also optionally be used to store instructions that are executed by controller 902 during the operation of system 900, and may be used to store user data. Memory 906 may be provided by one or more different types of memory. For example, memory 906 may comprise any type of random access memory, a volatile memory, a non-volatile memory, such as a flash memory and/or a memory, such as memory 100 discussed herein.

I/O device 904 may be used by a user to generate a message. Other devices may include a keypad, display, microphone, mouse, camera, sensor, and other electronic devices. System 900 may use wireless interface 908 to transmit and receive messages to and from a wireless communication network with radio frequency (RF), microwave, or infrared signals. Examples of wireless interface 908 may include one or more antennae or wireless transceivers, although the scope of the present invention is not limited in this respect.

It is appreciated that fabrication of current-confining structures of PCMS cells has been explained with reference to one or more exemplary embodiments, and that the claimed subject matter is not limited to the specific details given above. References in the specification made to other embodiments fall within the scope of the claimed subject matter.

In one or more embodiments described above, regarding minimizing contact area, memory chalcogenide and middle electrode do not physically need to be in contact, electrical communication between a memory chalcogenide and a middle electrode may be sufficient. In one or more embodiments, electrical communication between a memory chalcogenide and a heater electrode may be sufficient.

The figures as shown and described above are not necessarily limited to the presented layers of materials. For example, a memory cell structure may include other materials and/or additional layers of electrodes, insulators, chemical barriers, etch stops, chalcogenide, etc. In another example, chemical barriers have been shown in each embodiment, but are not necessarily required in each embodiment. Further, the figures are not necessarily limited to the order in which processes occur. In one or more embodiments, the actual sequence may occur out of order with what is presented and may still be within the scope of the claimed subject matter.

Any reference to "up", "down", "row", "column", "lateral", etc. was made to aid in illustrating one or more embodiments, and is not meant to be limiting in how memory 100 is to be oriented or utilized. In one example, references to "row" and "column" may be switched.

Reference in the specification to "an embodiment," "one embodiment," "some embodiments," or "other embodiments" means that a particular feature, structure, or characteristic described in connection with the embodiments is included in at least some embodiments, but not necessarily all embodiments, of the claimed subject matter. The various appearances of "an embodiment," "one embodiment," or "some embodiments" are not necessarily all referring to the same embodiments.

If the specification states a component, feature, structure, or characteristic "may", "might", or "could" be included, that particular component, feature, structure, or characteristic is not required to be included. If the specification or claim refers to "a" or "an" element, that does not mean there is only one of the element. If the specification or claims refer to "an additional" element, that does not preclude there being more than one of the additional element.

Those skilled in the art having the benefit of this disclosure will appreciate that many other variations from the foregoing description and drawings may be made within the scope of the claimed subject matter. Indeed, the claimed subject matter is not limited to the details described above. Rather, it is the following claims including any amendments thereto that define such scope and variations. Further, the order in which the claim elements are presented is not intended to be limiting to the scope of the claimed subject matter.

What is claimed is:

1. A phase-change memory, comprising:
a row interconnect material, the row material comprising a thickness, a length and a width, the length of the row interconnect material being substantially perpendicular to the width of the row interconnect material, the length of the row interconnect material being greater than the width of row interconnect material, and the thickness of the row interconnect material extending in a direction that is substantially perpendicular to the length and the width of the row interconnect material;
a first chalcogenide material formed above the row interconnect material, the first chalcogenide material comprising a thickness, a length and a width, the length of the first chalcogenide material being substantially perpendicular to the width of the first chalcogenide material, the thickness of the first chalcogenide material being substantially perpendicular to the length and the width of the first chalcogenide material and extending in substantially a same direction as the thickness of the row interconnect material;
a middle electrode material formed above the first chalcogenide material, the middle electrode material comprising a thickness, a length and a width, the length of the middle electrode material being substantially perpendicular to the width of the middle electrode material, the thickness of the middle electrode material being substantially perpendicular to the length and width of the middle electrode material and extending in substantially a same direction as the thickness of the row interconnect material;
a second chalcogenide material formed above the middle electrode material, the second chalcogenide material comprising a thickness, a length and a width, the length of the second chalcogenide material being substantially perpendicular to width of the second chalcogenide material, the thickness of the second chalcogenide material being substantially perpendicular to the length and the width of the second chalcogenide material and extending in substantially a same direction as the thickness of the row interconnect material; and a column interconnect material formed above the second chalcogenide material, the column interconnect material comprising a thickness, a length and a width, the length of the column interconnect material being substantially perpendicular to the width of the column interconnect material, and the thickness of the column interconnect material being substantially perpendicular to the length and the width of the column interconnect material and extending in substantially a direction as the thickness of the row interconnect material, a direction of the length of the column interconnect material being substantially orthogonal to the direction of the length of the row interconnect material, the length and the width of the middle electrode or the length and the width of the second chalcogenide material, or a combination thereof, being equal to or smaller than the width of the row interconnect material and the width of the column interconnect material.

2. The phase-change memory of claim 1, further comprising a spacer for creating the memory chalcogenide.

3. The phase-change memory according to claim 1, wherein the length and the width of the middle electrode is equal to or smaller than the width of the row interconnect material and the width of the column interconnect material.

4. The phase-change memory according to claim 1, wherein the length and width of the first chalcogenide material is equal to or smaller than the width of the row interconnect material and the width of the column interconnect material.

5. The phase-change memory according to claim 1, wherein the length and the width of the second chalcogenide material is equal to or smaller than the width of the row interconnect material and the width of the column interconnect material.

6. The phase-change memory according to claim 1, wherein the first chalcogenide material comprises a switch chalcogenide material and the second chalcogenide material comprises a memory chalcogenide material.

7. The phase-change memory according to claim 1, wherein the first chalcogenide material comprises a memory chalcogenide material and the second chalcogenide material comprises switch chalcogenide material.

* * * * *